United States Patent
Kim

(10) Patent No.: US 9,627,273 B2
(45) Date of Patent: *Apr. 18, 2017

(54) METHODS OF MANUFACTURING SEMICONDUCTOR DEVICES HAVING A NANOWIRE CHANNEL STRUCTURE

(71) Applicant: SAMSUNG ELECTRONICS CO., LTD., Suwon-si, Gyeonggi-do (KR)

(72) Inventor: Sang-Su Kim, Yongin-si (KR)

(73) Assignee: SAMSUNG ELECTRONICS CO., LTD., Suwon-si, Gyeonggi-do (KR)

(*) Notice: Subject to any disclaimer, the term of this patent is extended or adjusted under 35 U.S.C. 154(b) by 0 days.

This patent is subject to a terminal disclaimer.

(21) Appl. No.: 14/964,151

(22) Filed: Dec. 9, 2015

(65) Prior Publication Data

US 2016/0086861 A1 Mar. 24, 2016

Related U.S. Application Data

(62) Division of application No. 14/163,148, filed on Jan. 24, 2014, now Pat. No. 9,219,064.

(30) Foreign Application Priority Data

Jan. 25, 2013 (KR) .................... 10-2013-0008718

(51) Int. Cl.
H01L 21/8238 (2006.01)
H01L 27/092 (2006.01)
(Continued)

(52) U.S. Cl.
CPC .......... *H01L 21/823857* (2013.01); *H01L 21/823412* (2013.01); *H01L 21/823807* (2013.01);
(Continued)

(58) Field of Classification Search
CPC ....... H01L 21/823857; H01L 29/42392; H01L 29/0673; H01L 21/823412; H01L 21/823807; H01L 27/092
See application file for complete search history.

(56) References Cited

U.S. PATENT DOCUMENTS 7,145,246 B2 12/2006 Hareland et al.
7,374,986 B2 5/2008 Kim et al.
(Continued)

FOREIGN PATENT DOCUMENTS

JP 2011-211127 A 10/2011
KR 10-2005-0063101 A 6/2005
(Continued)

*Primary Examiner* — William Coleman
(74) *Attorney, Agent, or Firm* — Lee & Morse, P.C.

(57) ABSTRACT

A semiconductor device includes a first transistor and a second transistor. The first transistor includes a first nanowire extending through a first gate electrode and between first source and drain regions. The second transistor includes a second nanowire extending through a second gate electrode and between a second source and drain regions. The first nanowire has a first size in a first direction and a second size in a second direction, and the second nanowire has a second size in the first direction and substantially the second size in the second direction. The first nanowire has a first on current and the second nanowire has a second on current. The on current of the first nanowire may be substantially equal to the on current of the second nanowire based on a difference between the sizes of the first and second nanowires. In another arrangement, the on currents may be different.

19 Claims, 39 Drawing Sheets

(51) Int. Cl.
 *H01L 21/8234* (2006.01)
 *H01L 29/06* (2006.01)
 *H01L 29/423* (2006.01)

(52) U.S. Cl.
 CPC ........ *H01L 27/092* (2013.01); *H01L 29/0673* (2013.01); *H01L 29/42392* (2013.01)

(56) References Cited

U.S. PATENT DOCUMENTS

| | | |
|---|---|---|
| 7,851,790 B2 | 12/2010 | Rachmady et al. |
| 7,923,310 B2 | 4/2011 | Crowder et al. |
| 8,080,481 B2 | 12/2011 | Lee et al. |
| 8,399,879 B2 | 3/2013 | Liu et al. |
| 8,420,455 B2 * | 4/2013 | Bangsaruntip ......... B82Y 10/00 257/E21.404 |
| 8,580,624 B2 | 11/2013 | Bangsaruntip et al. |
| 8,872,161 B1 | 10/2014 | Ching et al. |
| 9,219,064 B2 * | 12/2015 | Kim ..................... H01L 27/092 |
| 2011/0070734 A1 | 3/2011 | Saracco et al. |

FOREIGN PATENT DOCUMENTS

| | | |
|---|---|---|
| KR | 10-2006-0001986 A | 1/2006 |
| KR | 10-2009-0065118 A | 6/2009 |
| KR | 10-2009-0081603 A | 7/2009 |
| KR | 10-2010-0025836 A | 3/2010 |
| KR | 10-2012-0037276 A | 4/2012 |
| WO | WO 2012/036879 A1 | 3/2012 |

* cited by examiner

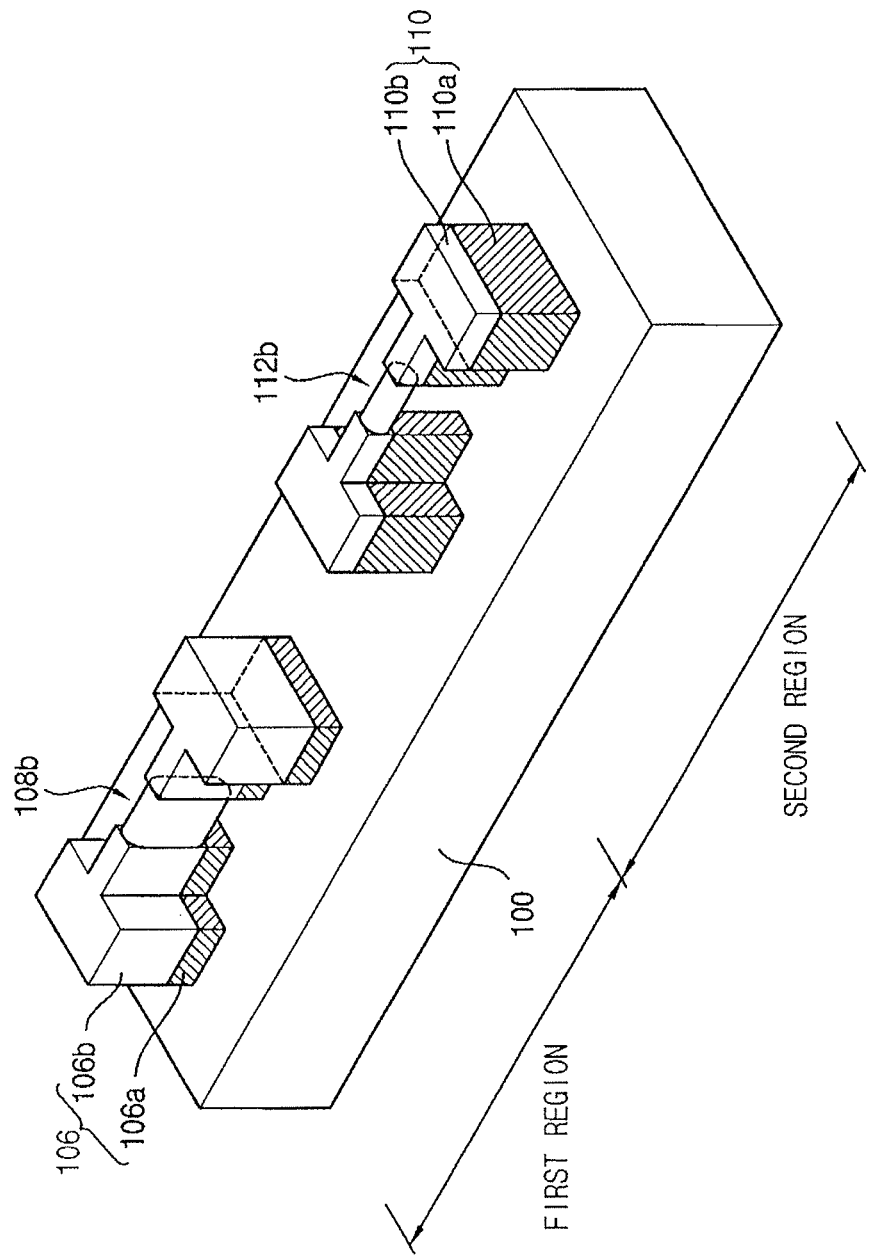

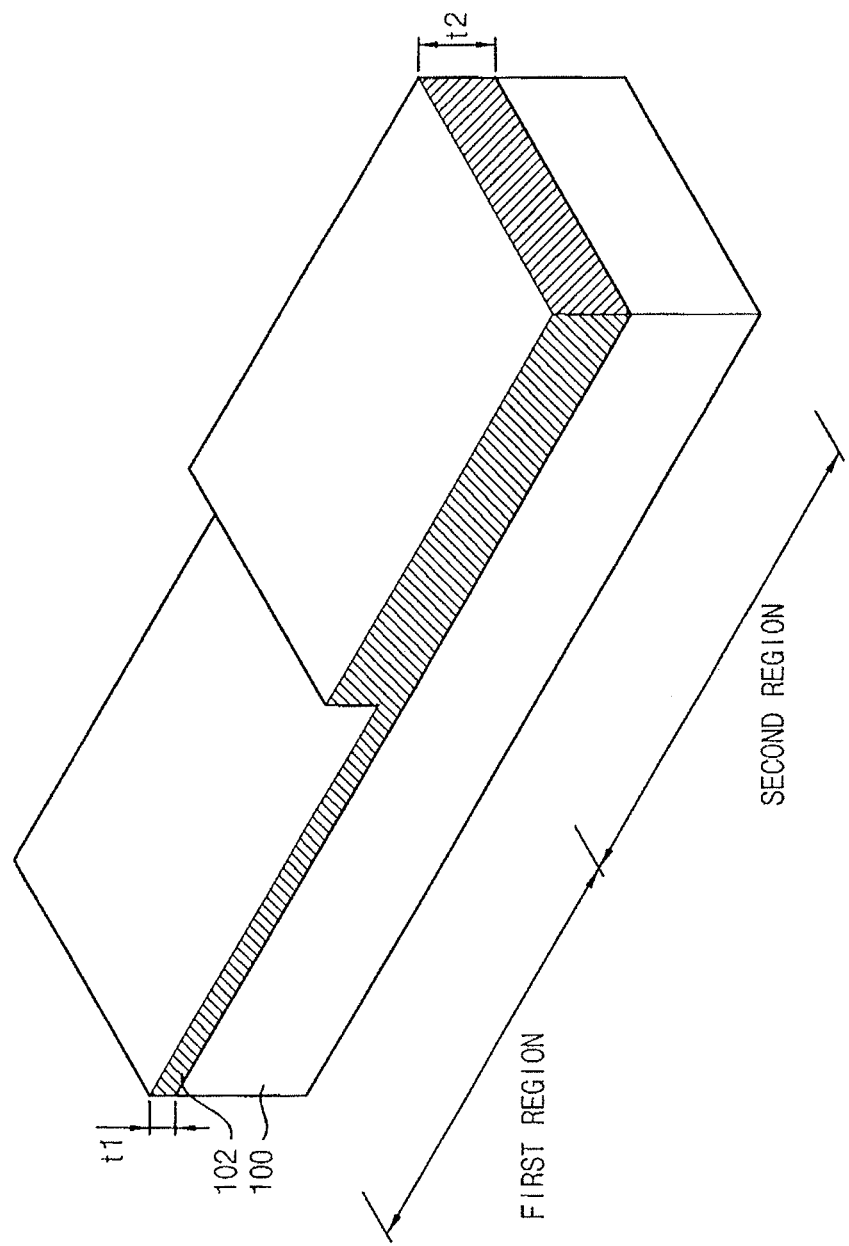

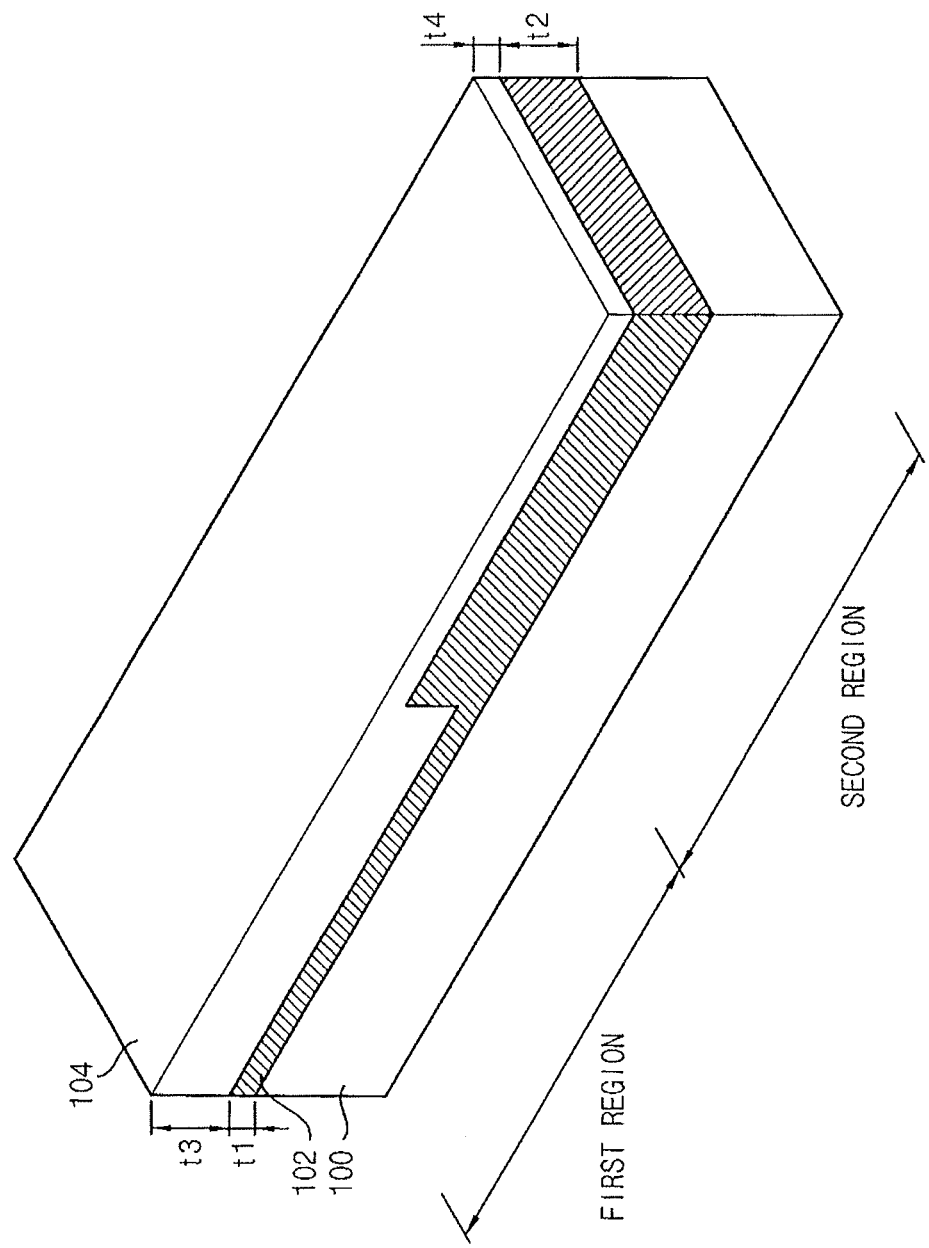

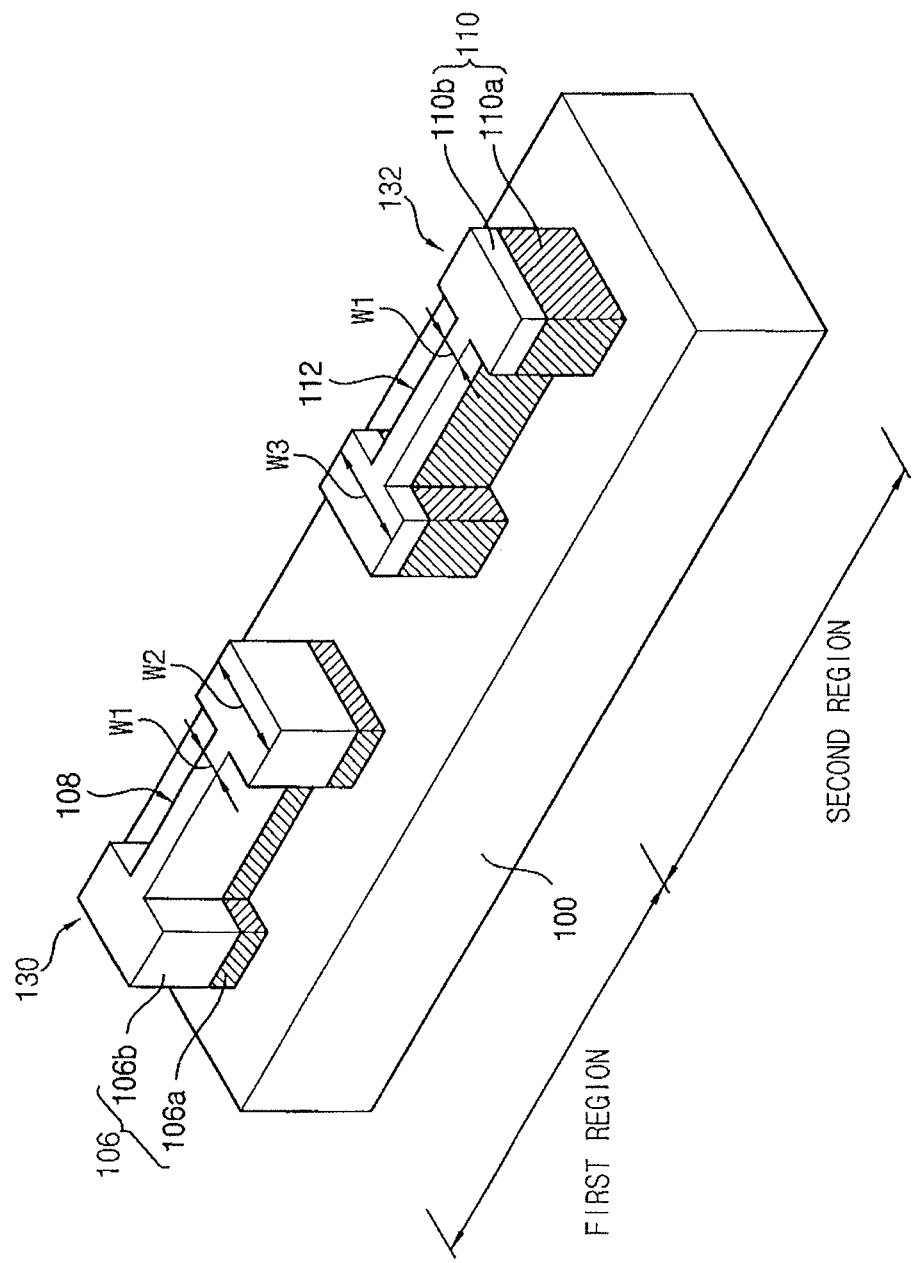

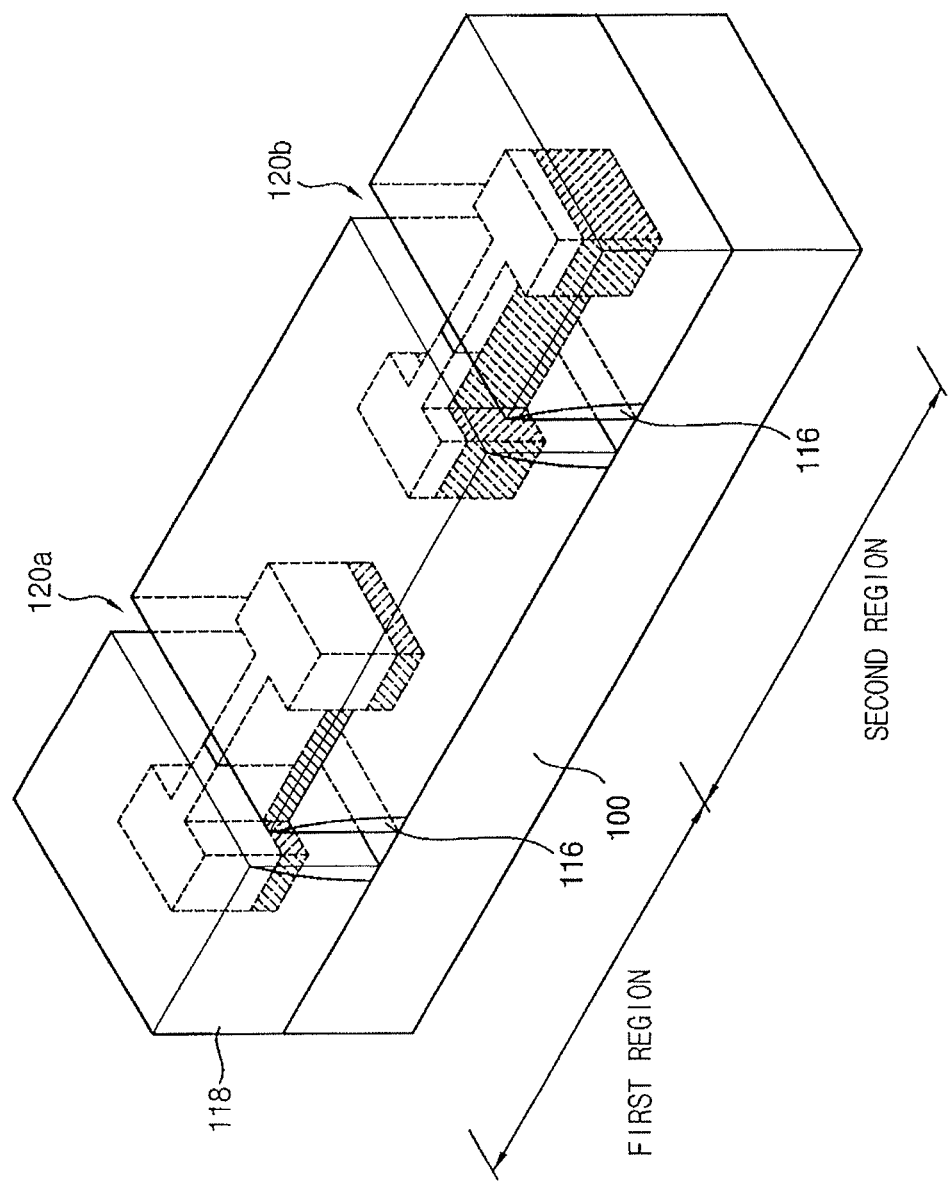

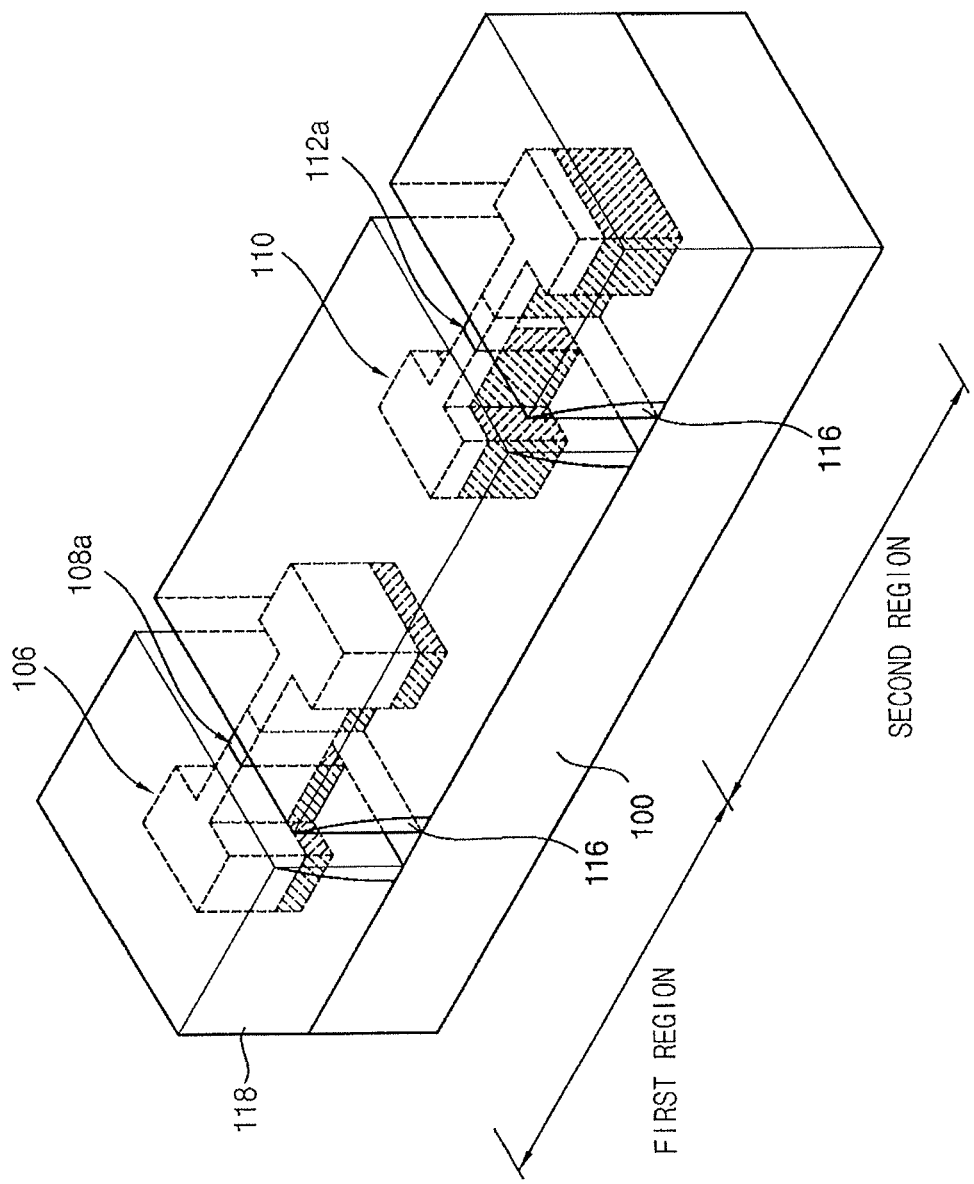

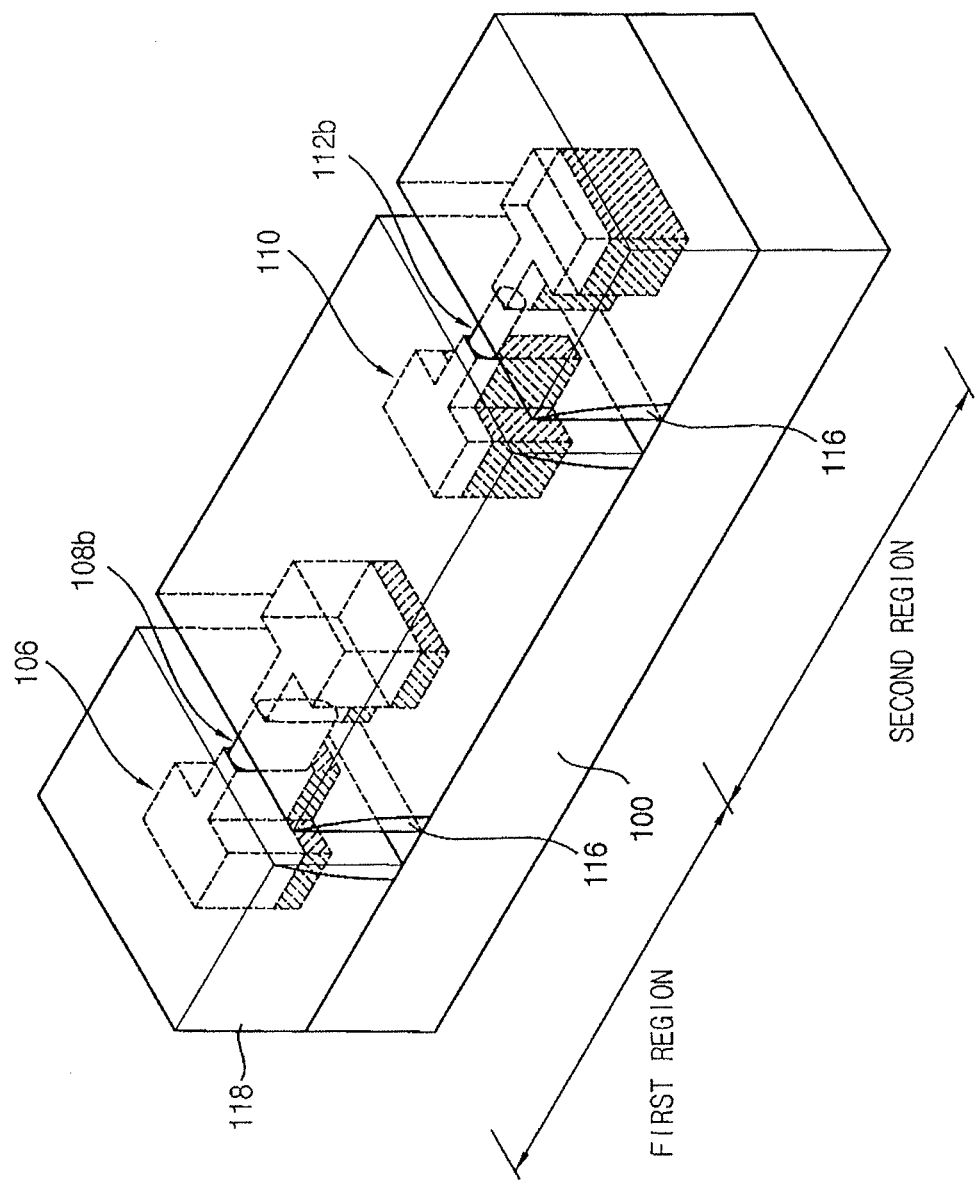

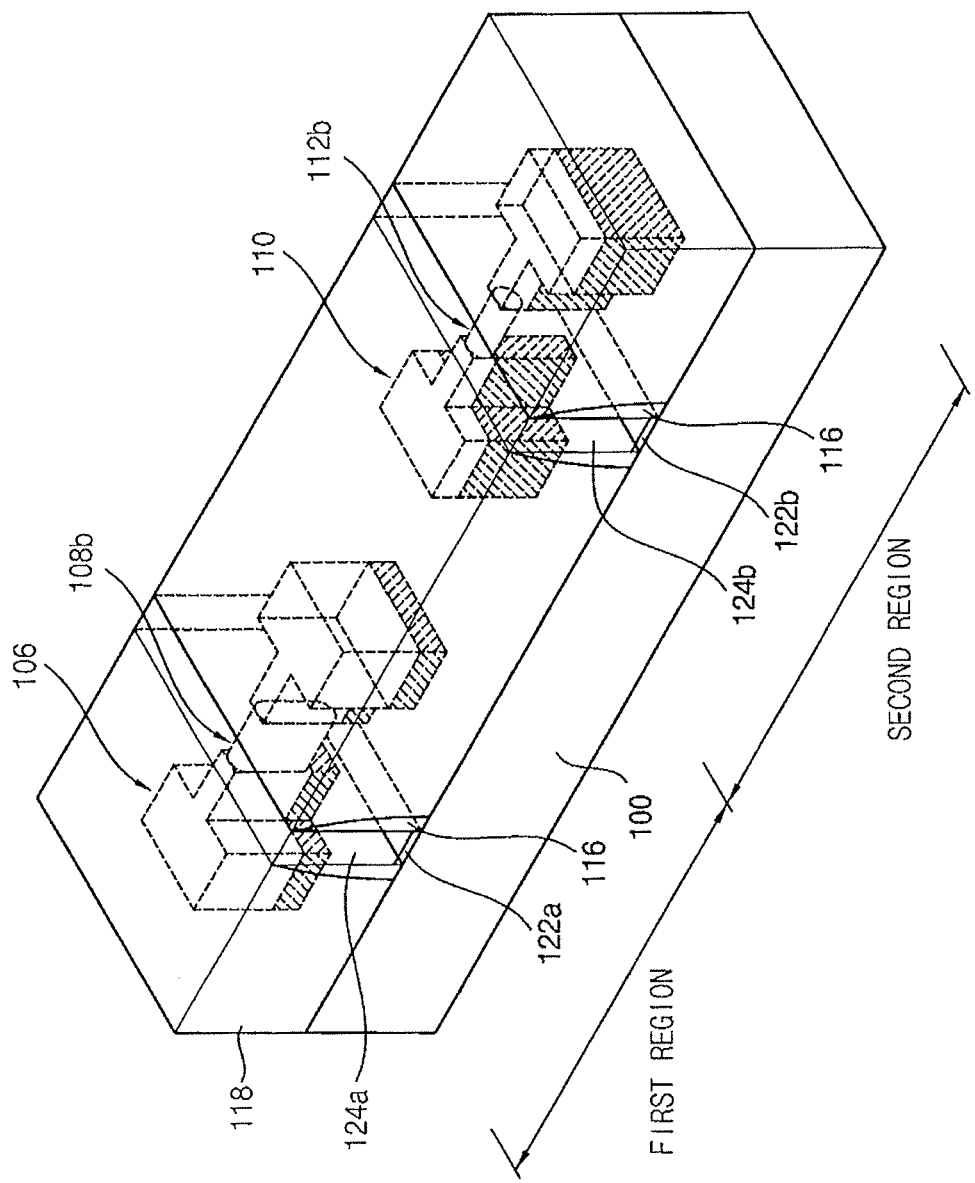

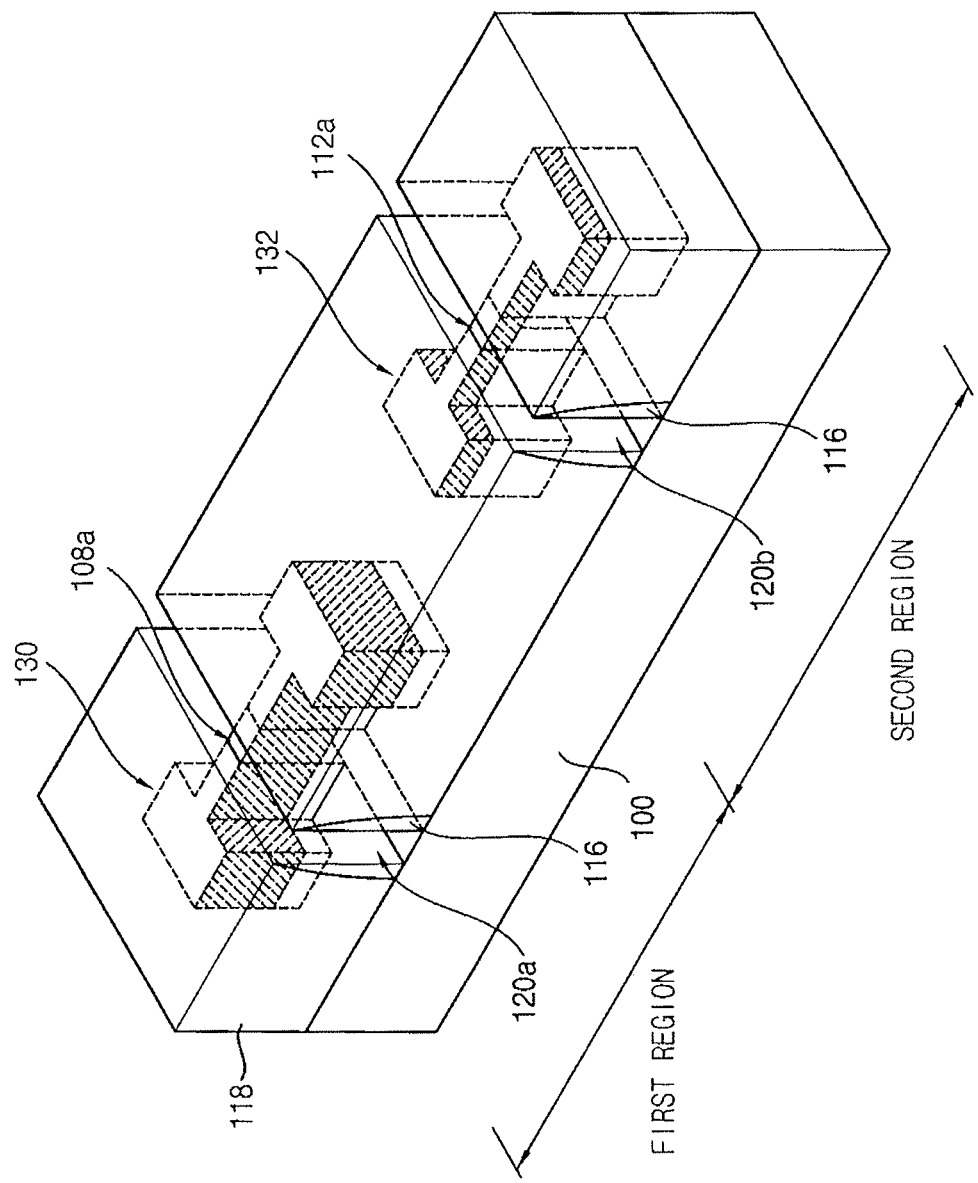

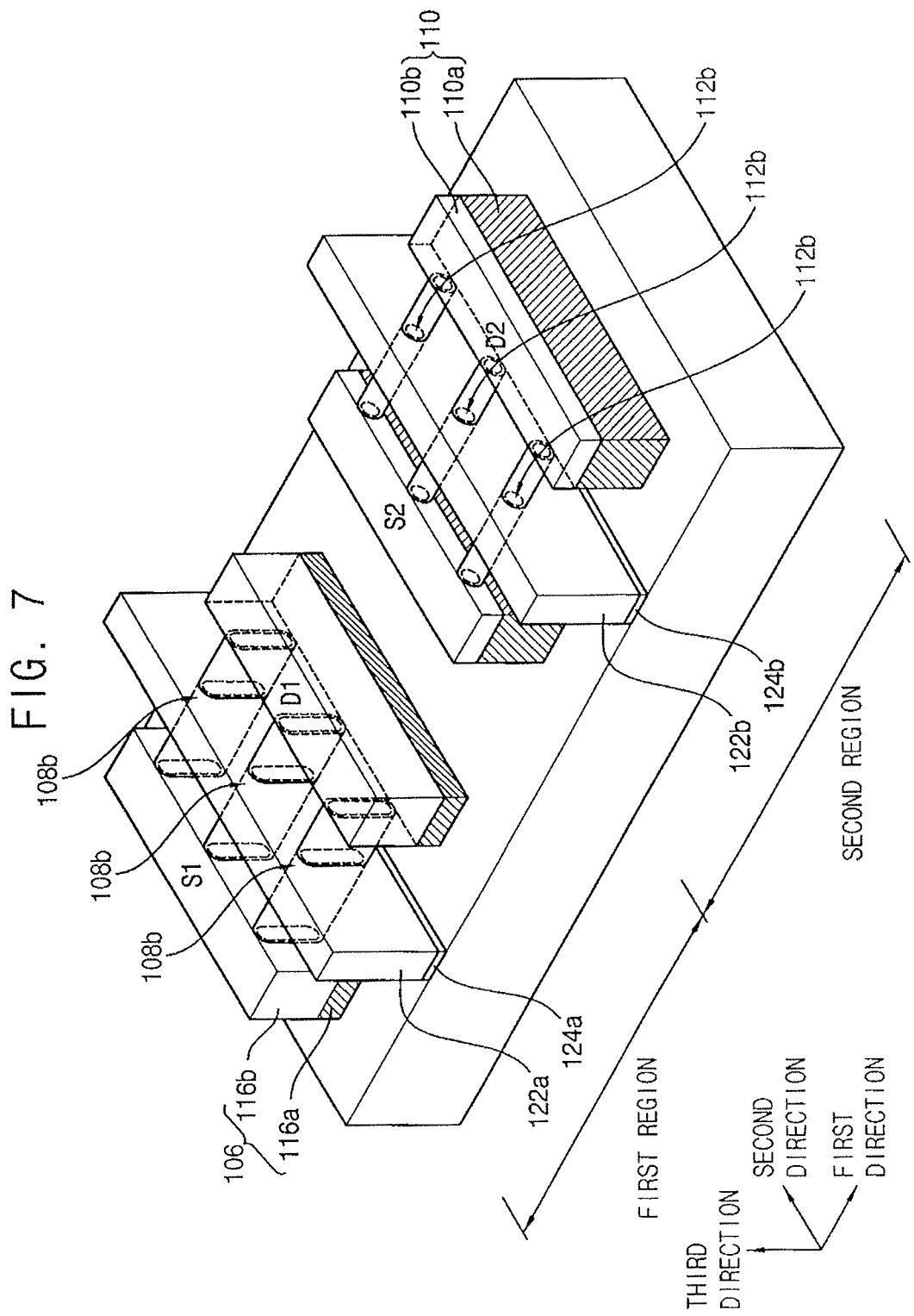

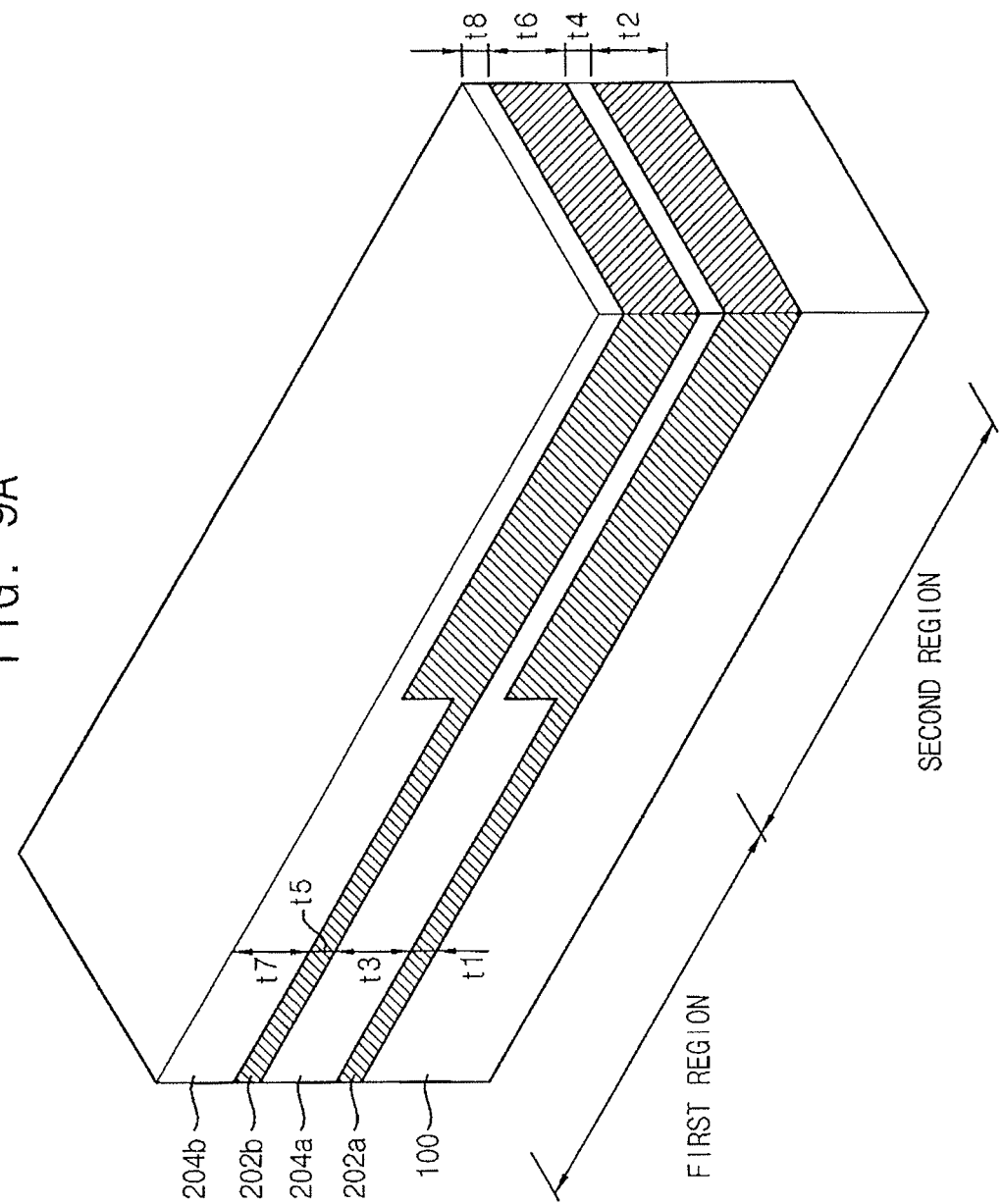

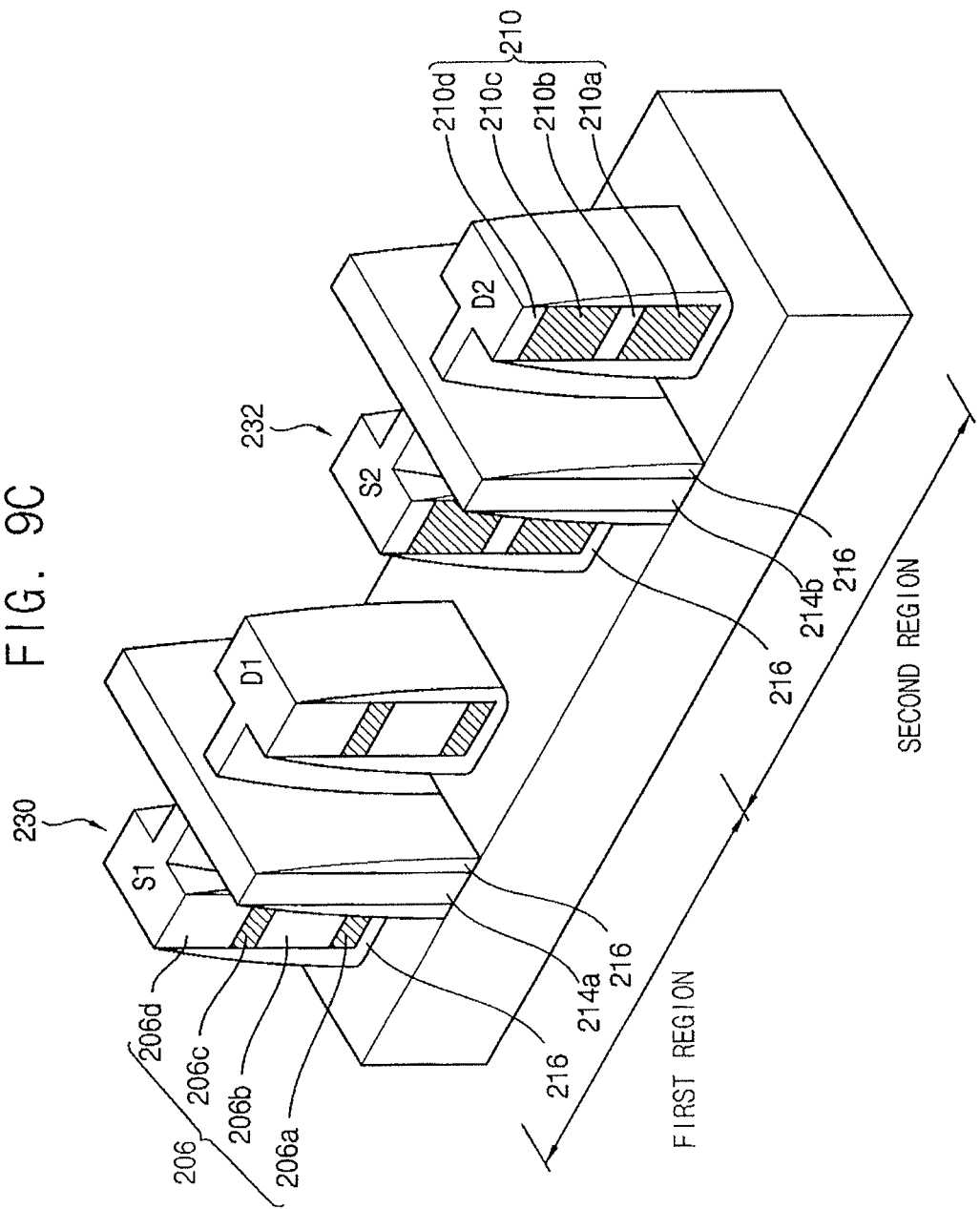

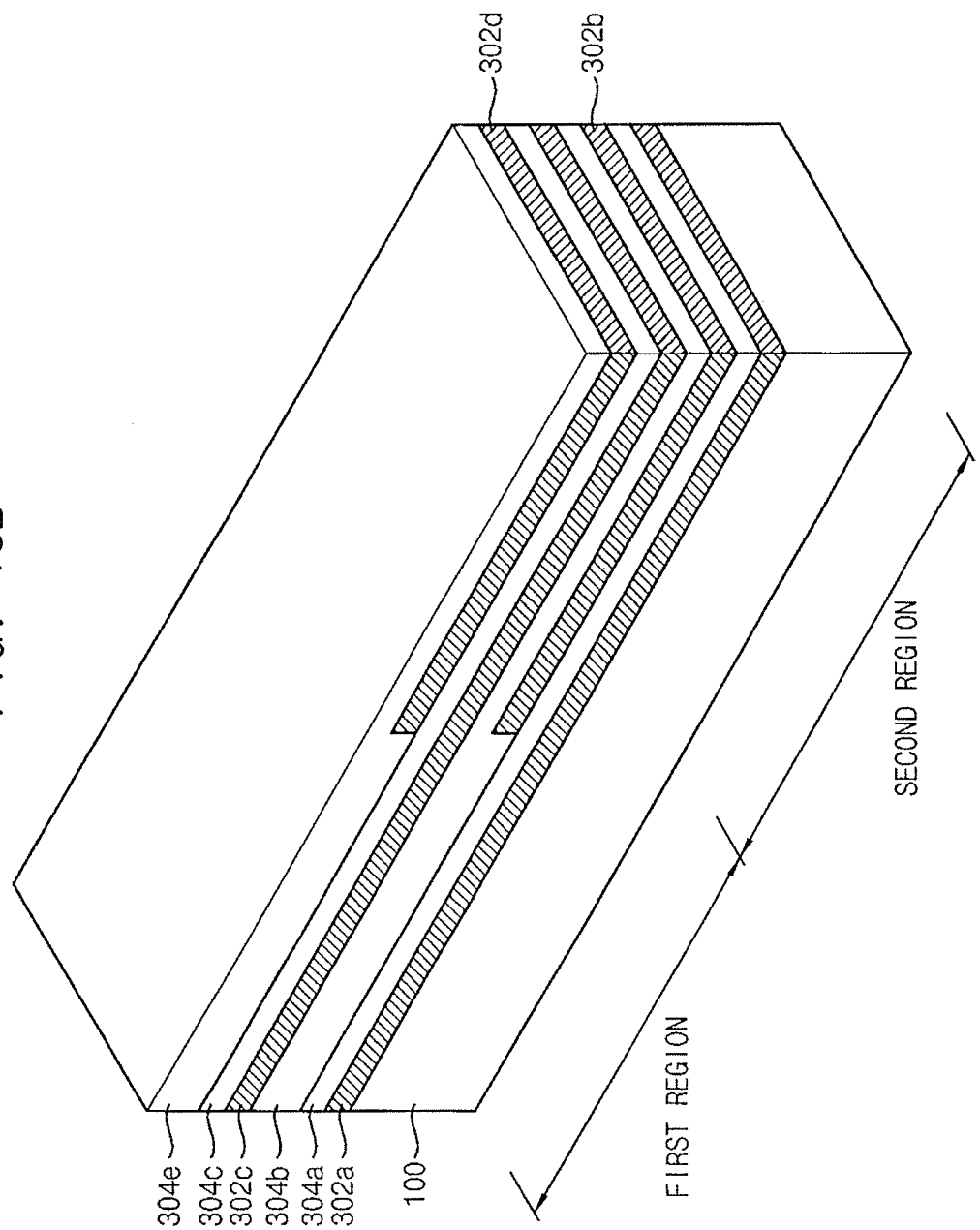

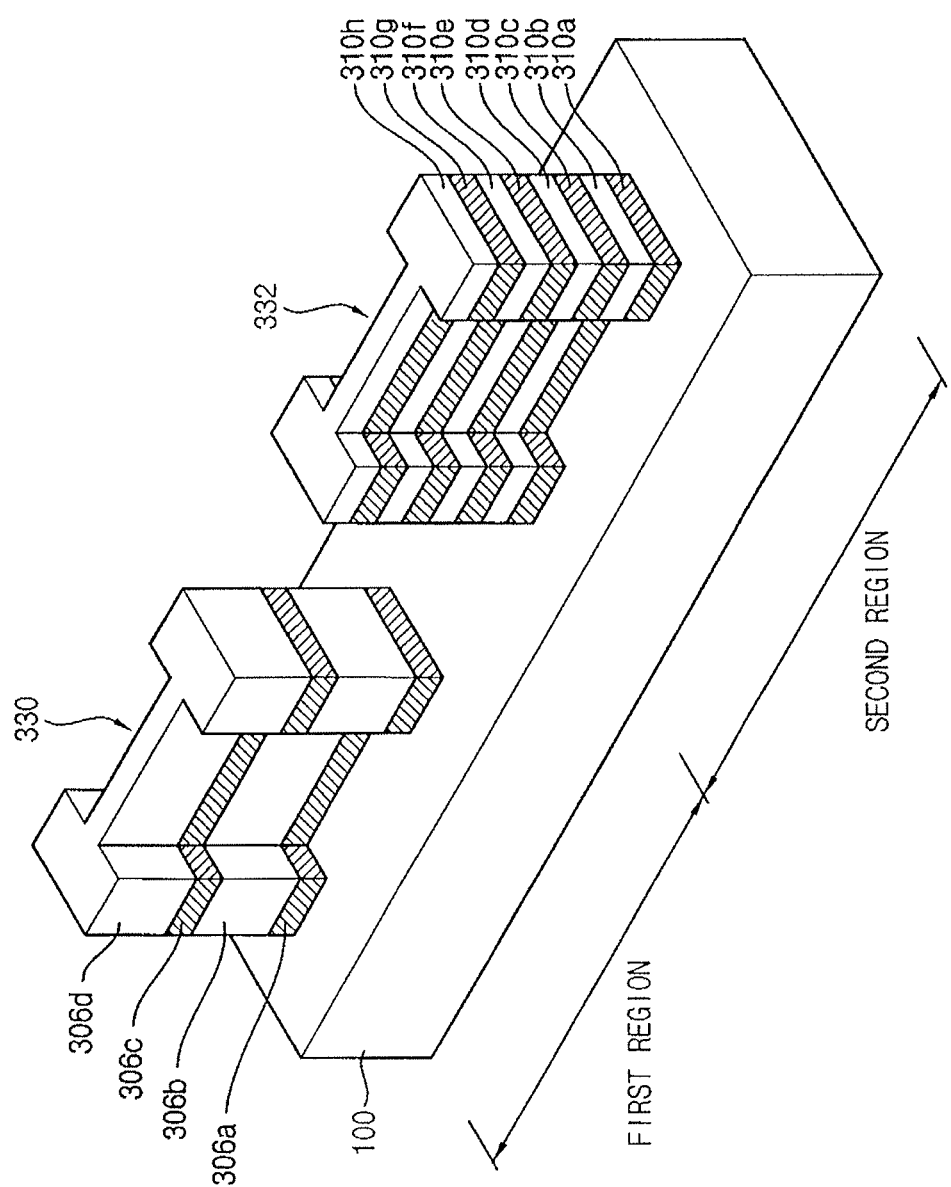

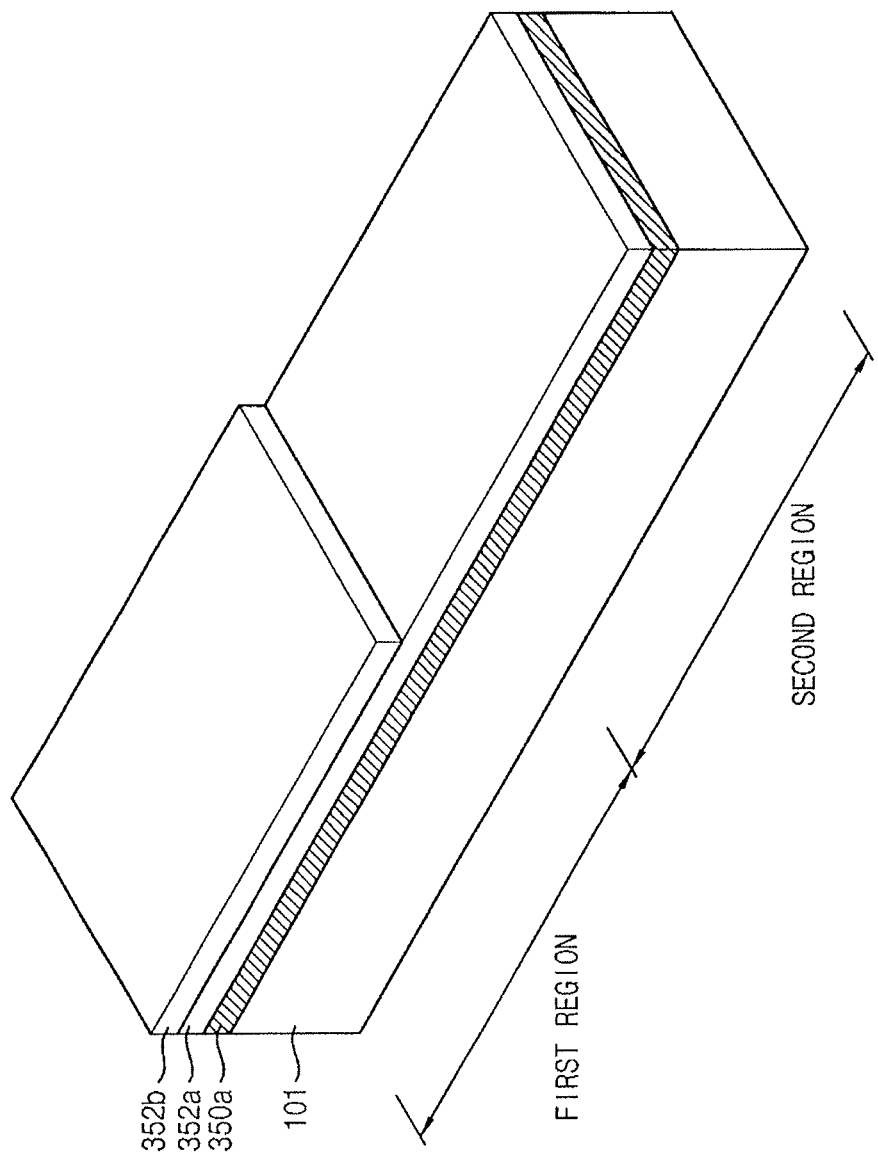

METHODS OF MANUFACTURING SEMICONDUCTOR DEVICES HAVING A NANOWIRE CHANNEL STRUCTURE

CROSS-REFERENCE TO RELATED APPLICATIONS

This is a divisional application based on pending application Ser. No. 14/163,148, filed Jan. 24, 2014, the entire contents of which is hereby incorporated by reference.

Korean Patent Application No. 10-2013-0008718, filed on Jan. 25, 2013, and entitled, "Semiconductor Devices Having a Nanowire Channel Structure and Methods of Manufacturing the Same," is incorporated by reference herein in its entirety.

BACKGROUND

1. Field

One or more embodiments described herein relate to semiconductor devices.

2. Description of the Related Art

Continuing efforts are being made to increase the integration and performance of MOS field effect transistors and the circuits which include them. As the size of a MOS transistor is scaled down, the distance between source/drain has decreased and defects such as short channel effect have occurred as a result. Attempts have been made to reduce these and other deficiencies in semiconductor devices.

SUMMARY

In accordance with one embodiment, a semiconductor device comprising at least one first nanowire pattern spaced from a surface of a substrate in a first region and including a semiconductor material, a cross-section of the first nanowire pattern having a first width in a horizontal direction and having a first vertical length in a vertical direction; at least one second nanowire pattern spaced from the surface the substrate in a second region and including the semiconductor material, a cross-section of the second nanowire pattern having the first width in the horizontal direction and having a second vertical length that is smaller than the first vertical length in the vertical direction; a first MOS transistor provided at the first nanowire pattern and including a first gate structure and first source/drain regions; and a second MOS transistor provided at the second nanowire pattern and including a second gate structure and second source/drain regions. The first vertical length in the first nanowire pattern may be greater than the first width.

Also, the first MOS transistor and the second MOS transistor have a same conductivity type. The first MOS transistor and the second MOS transistor may have different conductivity types. The first MOS transistor may be an n-type transistor, and the second MOS transistor may be a p-type transistor.

Also, the first gate structure comprises a first gate insulating layer on a surface of the first nanowire pattern, and a first gate electrode on the first gate insulating layer and surrounding the first nanowire pattern, and the second gate structure comprises a second gate insulating layer on a surface of the second nanowire pattern, and a second gate electrode on the second gate insulating layer and surrounding the second nanowire pattern. Longitudinal-sections of the first and second nanowire patterns may have a same first horizontal length in a horizontal direction.

Also, an uppermost surface of the first and second nanowire patterns are in substantially a same plane. Bottom surfaces of the first and second nanowire patterns may be in substantially a same plane.

Also, a plurality of the second nanowire patterns are stacked in the vertical direction and spaced from each other, and the second MOS transistor is located at the stacked second nanowire patterns.

Also, an uppermost surface of the second nanowire pattern is at an uppermost portion among the stacked second nanowire patterns in the vertical direction, and the uppermost surface of the second nanowire pattern is positioned in substantially a same plane as an uppermost surface of the first nanowire pattern.

Also, a plurality of first and second nanowire patterns are respectively stacked in the vertical direction and spaced a distance from each other, the first MOS transistor is located at the stacked first nanowire patterns, and the second MOS transistor is located at the stacked second nanowire patterns.

Also, a number of the stacked second nanowire patterns in the vertical direction is equal to a number of the stacked first nanowire patterns in the vertical direction, or a number of the stacked second nanowire patterns in the vertical direction is greater than a number of the stacked first nanowire patterns in the vertical direction. The first and second nanowire patterns include a same semiconductor material.

Also, first semiconductor structures may be connected to respective end portions of the first nanowire pattern, the first semiconductor structure having a second width greater than the first width of the first nanowire pattern; and second semiconductor structures may be connected to respective end portions of the second nanowire pattern, the second semiconductor structure having a third width greater than the first width of the second nanowire pattern.

Also, a plurality of first and second nanowire patterns are disposed in parallel to each other in a horizontal direction with the upper surface of the substrate, and end portions of the first and second nanowire patterns disposed horizontally with each other are respectively connected to the first and second semiconductor structures. The first and second semiconductor structures contact the substrate.

Also, each of the first and second semiconductor structures includes a first semiconductor material and a second semiconductor material having a predetermined etching selectivity with respect to the first semiconductor material.

In accordance with another embodiment, a method of manufacturing a semiconductor device, comprising: forming a first semiconductor material layer in a first region and a second region of a substrate; forming a second semiconductor material layer on the first semiconductor material layer, the second semiconductor material layer including a material different from the first semiconductor material and having a thickness in the second region greater than a thickness in the first region; patterning the first and second semiconductor material layers to form first and second nanowire structures having a first width in a horizontal region respectively in the first region and the second region; selectively removing the first semiconductor material layer in the first and second nanowire structures to respectively form a first nanowire pattern in the first region of the substrate and to form a second nanowire pattern in the second region of the substrate, the first nanowire pattern having a first width in a horizontal direction of a cross-section of the first nanowire pattern and a first vertical length in a vertical direction of the cross-section of the first nanowire pattern, the second nanowire pattern having a first width in the horizontal direction of a cross-section of the second nanowire pattern and a second vertical length greater than the first vertical length in the vertical direction of the cross-section of the second nanowire pattern; forming a first MOS transistor including a first gate structure and first source/drain regions in the first nanowire pattern; and forming a second MOS transistor including a second gate structure and second source/drain regions in the second nanowire pattern.

Also, the first semiconductor material layer includes a semiconductor material having a predetermined etching selectivity with respect to the second semiconductor material layer.

Also, the first semiconductor material layer includes silicon germanium, and the second semiconductor material layer includes single crystalline silicon.

Also, the thickness of the first semiconductor material layer on the substrate in the first region is less than the thickness of the first semiconductor material layer on the substrate in the second region.

Also, performing an annealing process or an oxidation process for rounding edge portions of the first and second nanowire patterns, wherein the annealing or oxidation processor may be performed after forming the first and second nanowire patterns.

Also, forming a third nanowire pattern and a fourth nanowire pattern may include a third semiconductor material different from the second semiconductor material layer, wherein forming the third nanowire pattern and the fourth nanowire pattern includes performing a thermal oxidation process at each of a plurality of surface portions of the first and second nanowire patterns, to diffuse at least a portion of materials forming the first and second nanowire patterns, after forming the first and second nanowire patterns.

Also, the method may include (a) forming extended dummy gate patterns surrounding the first and second nanowire structures; (b) forming an insulating interlayer pattern to fill a gap between the dummy gate patterns; and (c) removing the dummy gate patterns between the insulating interlayer patterns to form an opening portion exposing a gate electrode forming portion, wherein (a), (b), and (c) are performed after forming the first and second nanowire structures.

In accordance with another embodiment, a semiconductor device comprising: a first transistor including a first nanowire extending through a first gate electrode and between first source and drain regions; a second transistor including a second nanowire extending through a second gate electrode and between a second source and drain regions, wherein the first nanowire has a first size in a first direction and a second size in a second direction, and the second nanowire has a third size in the first direction and substantially the second size in the second direction.

Also, the first nanowire has a first on current, the second nanowire has a second on current, and the on current of the first nanowire is substantially equal to the on current of the second nanowire based on a difference between the first size of the first nanowire in the first direction and the third size of the second nanowire in the first direction.

Also, the first transistor has a first on current, the second transistor has a second on current different from the first on current. The first transistor has a first conductivity type, the second transistor has a second conductivity type, and the first and second transistors correspond to a CMOS device.

Also, a length of the first nanowire in a third direction is substantially equal to a width of the first gate electrode, or a length of the second nanowire in the third direction is substantially equal to a width of the second gate electrode.

Also, a length of the first nanowire in a third direction is substantially equal to a width of the first gate electrode, and a length of the second nanowire in the third direction is substantially equal to a width of the second gate electrode.

Also, the first nanowire has a first capacity of charge carrier mobility, and the second nanowire has a second capacity of charge carrier mobility. The second capacity of charge carrier mobility may be different from the first capacity of charge carrier mobility.

Also, the first size in the first direction may be greater than the third size in the first direction. An upper surface of the first nanowire may be substantially coplanar with an upper surface of the second nanowire.

Also, the first and second transistors are formed on a substrate, the first nanowire is spaced from the substrate by a first distance, and the second nanowire is spaced from the substrate by a second distance different from the first distance.

BRIEF DESCRIPTION OF THE DRAWINGS

Features will become apparent to those of ordinary skill in the art by describing in detail exemplary embodiments with reference to the attached drawings in which:

FIG. 2B illustrates another embodiment of a nanowire pattern portion and a semiconductor pattern portion;

FIGS. 4A to 4I illustrate a first embodiment of a method of manufacturing the semiconductor device in FIG. 1;

FIGS. 6A to 6D illustrate a third embodiment of a method of manufacturing the semiconductor device in FIG. 1;

FIG. 7 illustrates a second embodiment of a semiconductor device;

FIGS. 9A to 9C are views provided to explain a method of manufacturing the semiconductor device in FIG. 8;

FIGS. 15A to 15C are views provided to explain a method of manufacturing the semiconductor device in FIG. 13;

FIGS. 18A and 18B are additional views of the semiconductor device in FIG. 16;

DETAILED DESCRIPTION

Figure 1:
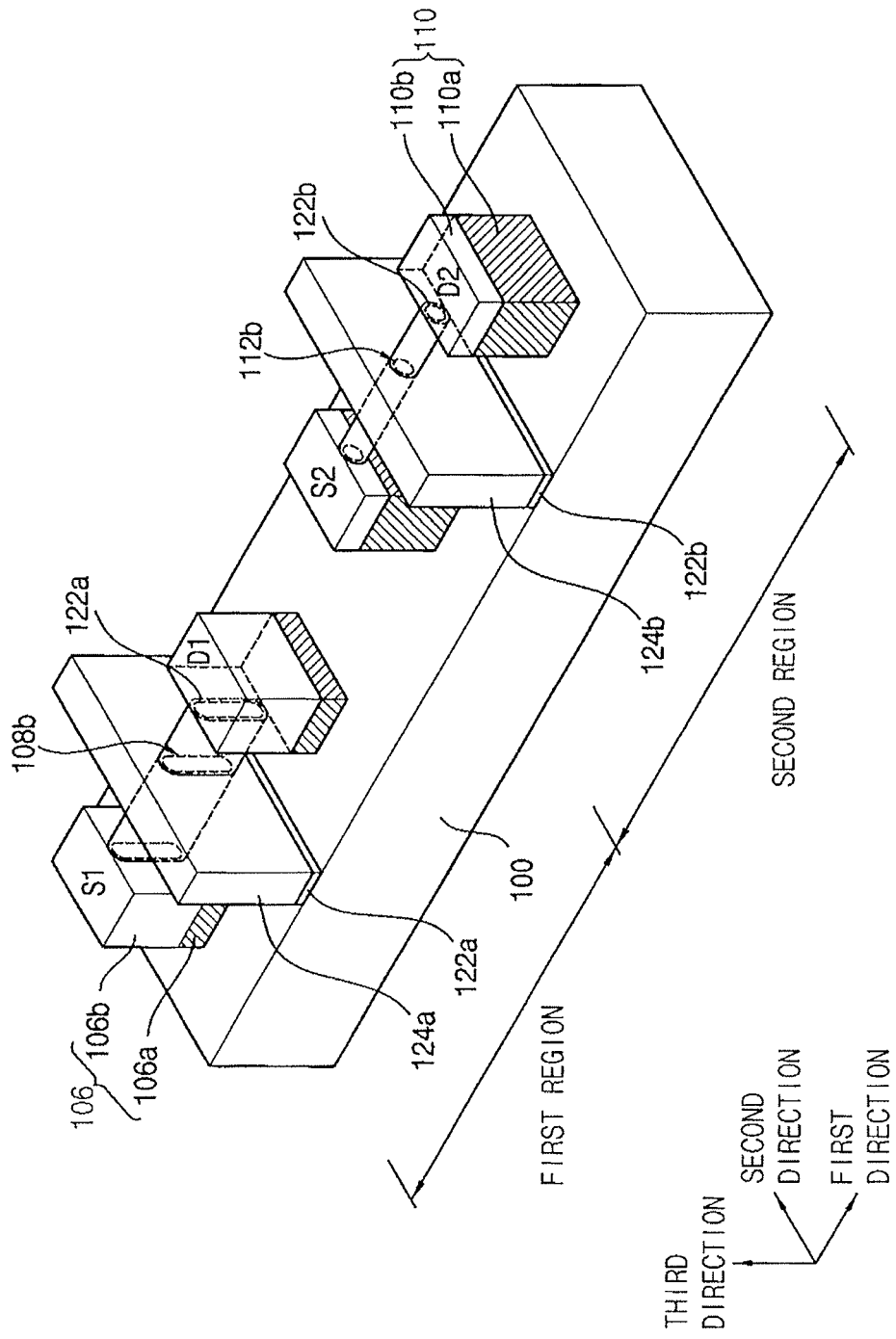
FIG. 1 illustrates a first embodiment of a semiconductor device.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

First Embodiment

Figure 2A:
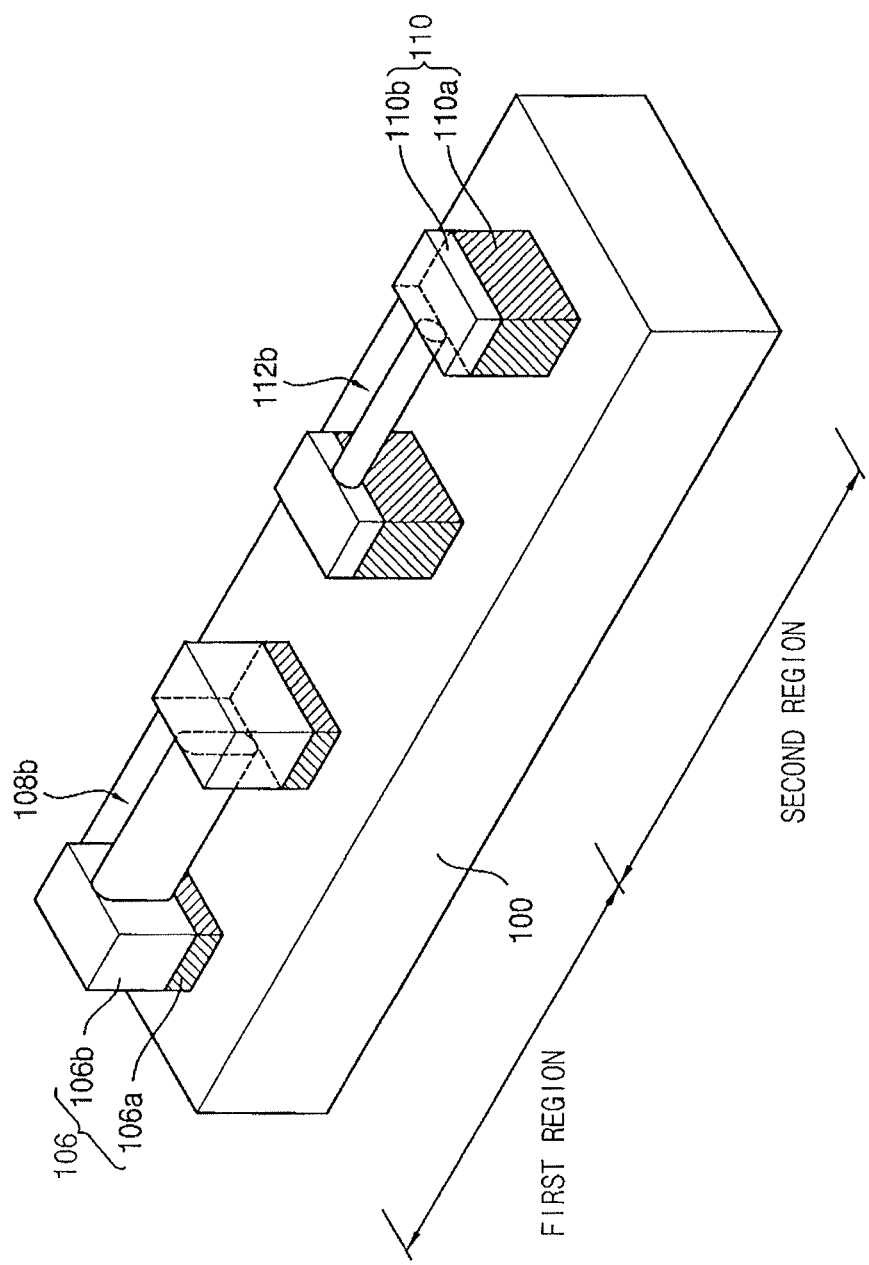
FIG. 2A illustrates an embodiment of a nanowire pattern portion and a semiconductor pattern portion in the semiconductor device of FIG. 1.
Figure 3:
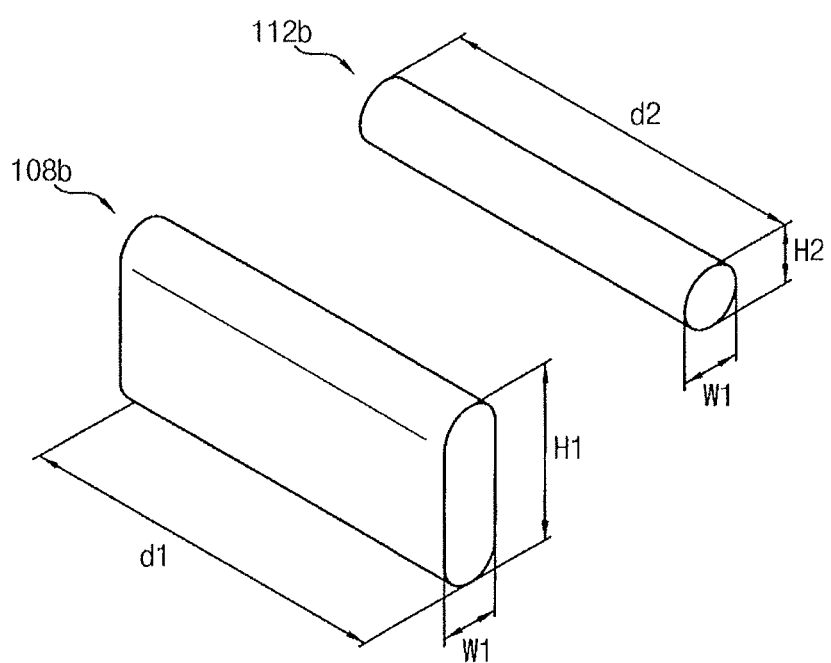
FIG. 3 is a view provided to explain the nanowire pattern in FIG. 1.

FIG. 1 illustrates a first embodiment of a semiconductor device. FIG. 2A illustrates a perspective view of a nanowire pattern portion and a semiconductor pattern portion in accordance with example embodiments, and FIG. 2B illustrates a perspective view of a nanowire pattern portion and a semiconductor pattern portion in accordance with another example embodiment. FIG. 3 illustrates a perspective view for explaining the nanowire pattern illustrated in FIG. 1.

Referring to FIGS. 1 to 3, a first nanowire pattern 108b may be formed in the first region of a substrate 100. A first MOS transistor using a portion of the first nanowire pattern 108b as a channel may be provided at the first nanowire pattern 108b. In addition, a second nanowire pattern 112b may be provided in the second region of the substrate 100. A second MOS transistor using a portion of the second nanowire pattern 112b as a channel may be provided at the second nanowire pattern 112b.

The first nanowire pattern 108b may be positioned at a distance from the upper surface of the substrate 100 in the first region. The first nanowire pattern 108b may include a semiconductor material. The semiconductor material may include, for example, single crystalline silicon or germanium. The single crystalline silicon used in the first nanowire pattern 108b may be tensile-strained Si or compressive-strained Si.

As illustrated in FIG. 3, the first nanowire pattern 108b may have an extended shape in a longitudinal direction as a first direction. The first direction may be a direction of the channel length of the first MOS transistor. The cross-section of the first nanowire pattern 108b may have a first width (W1) in a horizontal direction and a first vertical length (H1) in a third direction that is perpendicular to the first direction. The vertical length (H1) may be greater than the first width (W1). In addition, the first width (W1) may be decreased to the line width limit of a process for the high integration of a semiconductor device. Particularly, the first width (W1) may be from a few nm to hundreds of nm degree, and, more particularly, be from about 7 to about 40 nm.

The cross-section of the first nanowire pattern 108b may have an elliptical shape or a rectangular shape having a greater length in the third direction. The cross-section of the first nanowire pattern 108b may be a cross-section taken along a second direction that may be perpendicular to the first direction. The first nanowire pattern 108b may have a first horizontal length (d1) extended in the first direction.

Since the first nanowire pattern 108b may be provided as the channel region of the first MOS transistor, the electrical properties of the first MOS transistor may be changed according to the capacity of the first nanowire pattern 108b. Particularly, when the capacity of the first nanowire pattern 108b is increased, more charges may be transferred through the first nanowire pattern 108b, and the on current of the first MOS transistor may be increased.

The first nanowire pattern 108b may have a lengthwise cross-section in the third direction and may have a greater internal capacity than the second nanowire pattern 112b. In addition, the first vertical length of the first nanowire pattern 108b may be increased in order to further increase the capacity of the first nanowire pattern 108b. By controlling the first vertical length of the first nanowire pattern 108b, the on current of the first MOS transistor may be controlled.

In one embodiment, the first width of the nanowire pattern may be increased or the number of the nanowire patterns may be increased in order to increase the on current. In this case, the number of the manufacturing processes or the horizontal area occupied by the MOS transistor may be increased, to manufacture a MOS transistor having a high on current.

In accordance with example embodiments, the first width (W1) of the first nanowire pattern 108b may not be increased but only the first vertical length (H1) may be increased, to thereby increase the on current of the first MOS transistor. As described above, the first nanowire pattern may have a shape in which the first width in the horizontal direction may be kept relatively narrow, and the first vertical length may be increased. Thus, the on current may be sufficiently increased without increasing the horizontal area occupied by the semiconductor device.

Meanwhile, since the first nanowire pattern 108b may be spaced apart from the surface of the substrate 100, the whole surface including the upper portion, the side wall, and the lower portion of the first nanowire pattern 108b may be provided as the channel region of the first MOS transistor.

As illustrated in FIG. 2A, the first nanowire pattern 108b may have a length in the first direction greater than the gate length of the first MOS transistor. Alternatively, as illustrated in FIG. 2B, the first nanowire pattern 108b may have a same length in the first direction as the gate length of the first MOS transistor. That is, the first nanowire pattern 108b may be provided only in the channel region of the first MOS transistor.

Each of first semiconductor structures 106 may be connected with both end portions of the first nanowire pattern 108b. First source/drain regions S1 and D1 of the first MOS transistor may be provided at the first semiconductor structures 106. In addition, the upper surface of the first semiconductor structures 106 may be a contact forming portion. Thus, the upper surface of the first semiconductor structures 106 may have an area for forming contacts. The first semiconductor structures 106 may therefore have a second width greater than the first width of the first nanowire pattern 108b.

The first semiconductor structure 106 may have a shape directly contacting the surface of the substrate 100. The uppermost surface of the first semiconductor structure 106 may be positioned at a same plane as the uppermost surface of the first nanowire pattern 108b. The uppermost surfaces of the first semiconductor structure 106 and the nanowire pattern 108b may be positioned at the same height.

In one embodiment, the first semiconductor structure 106 has a stacked shape of a first semiconductor pattern 106a and a second semiconductor pattern 106b. The first semiconductor pattern 106a may include a material having a predetermined etching selectivity with respect to the second semiconductor pattern 106b. The first semiconductor pattern 106a may be formed by using a first semiconductor material, and the second semiconductor pattern 106b may be formed by using a second semiconductor material. For example, the first semiconductor material may include silicon germanium and the second semiconductor material may include single crystalline silicon. Alternatively, the first semiconductor material may include silicon and the second semiconductor material may include silicon germanium.

The second semiconductor material may include a same material as the semiconductor material forming the first nanowire pattern 108b. Alternatively, the second semiconductor material may include other material than the semiconductor material forming the first nanowire pattern 108b. The first nanowire pattern 108b may be supported by the side wall of the second semiconductor pattern 106b and may be extended. In the first semiconductor structure 106, the second semiconductor pattern 106b may be formed to have a thickness greater than the first semiconductor pattern 106a.

The second nanowire pattern 112b may be positioned so as to be spaced apart from the upper surface of the substrate 100 in the second region. The second nanowire pattern 112b may include the second semiconductor material. That is, the first and second nanowire patterns 108b and 112b may be formed by using a same semiconductor material. In addition, the semiconductor materials forming the first and second nanowire patterns may have same stress properties.

As illustrated in FIG. 3, the second nanowire pattern 112b may have an extended shape in the lengthwise direction as the first direction. The second nanowire pattern 112b may have a second horizontal length (d2) in the first direction. The first horizontal length (d1) of the first nanowire pattern 108b and the second horizontal length (d2) of the second nanowire pattern 112b may be the same or different.

The cross-section of the second nanowire pattern 112b may have the first width (W1) in the horizontal direction and may have a second vertical length (H2) smaller than the first vertical length (H1) in the vertical direction. The cross-section of the second nanowire pattern 112b may have an elliptical, circular or rectangular shape having a smaller length in the vertical direction in the cross-section of the first nanowire pattern 108b. As described above, the first width (W1) of the cross-section of the second nanowire pattern 112b may be the same as the first width (W1) of the cross-section of the first nanowire pattern 108b. That is, the first width may be decreased to the line width limit of a process.

The upper surface of the second nanowire pattern 112b may be positioned at the same plane as the upper surface of the first nanowire pattern 108b. As described above, since the upper surfaces of the first and second nanowire patterns 108b and 112b may have little step difference, subsequent processes may be easily performed. In addition, a second distance between the second nanowire pattern 112b and the substrate 100 may be greater than a first distance between the first nanowire pattern 108b and the substrate 100.

The second nanowire pattern 112b may be provided as the channel region of the second MOS transistor. As illustrated in FIG. 3, since the second nanowire pattern 112b may have a smaller capacity than the first nanowire pattern 108b, when the first and second MOS transistors are formed by the same manufacturing processes, the second MOS transistor may have a smaller on current than the first MOS transistor. As described above, the on current of the second MOS transistor may be controlled by controlling the second vertical length (H2) of the second nanowire pattern 112b.

As illustrated in FIG. 2A, the second nanowire pattern 112b may have a first direction length greater than the gate length of the second MOS transistor. Alternatively, as illustrated in FIG. 2B, the second nanowire pattern may have the same first direction length as the gate length of the second MOS transistor. That is, the second nanowire pattern may be provided only in the channel region of the second MOS transistor.

The second semiconductor structures 110 may be coupled to respective end portions of the second nanowire pattern 112b. In the second semiconductor structures 110, the second source/drain regions S2 and D2 of the second MOS transistor may be provided. In addition, the upper surface of the second semiconductor structure 110 may be a contact forming portion. Thus, the upper surface of the second semiconductor structures 110 may have an area for forming the contacts. The second semiconductor structures 110 may have a third width greater than the first width of the second nanowire pattern 112b. The second and third widths may be the same or different.

The second semiconductor structure 110 may directly contact the surface of the substrate. The uppermost surface of the second semiconductor structure 110 may be positioned at the same plane as the uppermost surface of the second nanowire pattern 112b. In addition, the uppermost surface of the second semiconductor structure 110 may be positioned at the same plane as the uppermost surface of the first semiconductor structure. As described above, since the upper surfaces of the first and second semiconductor structures 108 and 110 may have little step difference, subsequent processes may be easily performed.

The second semiconductor structure 110 may have a stacked structure of a third semiconductor pattern 110 and a fourth semiconductor pattern 110b. The third semiconductor pattern 110a may include the first semiconductor material, and the fourth semiconductor pattern 110b may include the second semiconductor material. The fourth semiconductor pattern 110b may be formed, for example, using the same material as the second nanowire pattern 112b. In addition, the second nanowire pattern 112b may be extended from the side wall portion of the fourth semiconductor pattern 110b and may be supported by the fourth semiconductor pattern 110b. Thus, in the second semiconductor structure 110, the third semiconductor pattern 110a may be formed to have a thickness greater than the fourth semiconductor pattern 110b.

The first MOS transistor may include a first gate insulating layer 122a, a first gate electrode 124a, and first source/drain regions S1 and S2.

The first gate insulating layer 122a may be provided on the surface of the first nanowire pattern 108b. The first gate insulating layer 122a may include silicon oxide. Alternatively, the first gate insulating layer 122a may include a metal oxide having higher dielectric constant when compared with the silicon oxide. The first gate electrode 124a may be provided on the first gate insulating layer 122a and may have an extended shape surrounding the first nanowire pattern 108b. The first gate electrode 122b may include a metal material. Alternatively, the first gate electrode 124a may include an impurity doped polysilicon material.

The first source/drain regions S1 and D1 may be provided at the first nanowire pattern 108b and the second semiconductor patterns 106b at respective sides of the first gate electrode 124a.

The second MOS transistor may include a second gate insulating layer 122b, a second gate electrode 124b, and second source/drain regions S2 and D2.

The second gate insulating layer 122b may be provided on the surface of the second nanowire pattern 112b. The second gate insulating layer 122b may include silicon oxide. Alternatively, the second gate insulating layer 122b may include a metal oxide having a higher dielectric constant than the silicon oxide. The second gate electrode 124b may be provided on the second gate insulating layer 122b and may have an extended shape surrounding the second nanowire pattern 112b. The second gate electrode 124b may include a metal material. Alternatively, the second gate electrode 124b may include an impurity doped polysilicon material. The second source/drain regions S2 and D2 may be provided at the second nanowire pattern 112b and the fourth semiconductor pattern 110b at both sides of the second gate electrode 124b.

Additionally, an insulating spacer may be provided at the side wall of the first and second gate electrodes 124a and 124b, as illustrated, for example, in FIG. 4I. In addition, an insulating interlayer covering the first and second gate electrodes may be provided on the substrate 100.

In accordance with example embodiments, the first MOS transistor and the second MOS transistor may have different conductivity types. That is, first impurities doped into the first source/drain regions S1 and D1 may have a different conductive type from second impurities doped into the second source/drain regions S2 and D2. Together, the first and second MOS transistors may form a CMOS transistor device.

In one embodiment, an NMOS transistor and a PMOS transistor included in the CMOS transistor device may be designed so that each of the transistors may have almost the same on current. Since the mobility of electrons and the mobility of holes may be different according to the orientation of the channel pattern and the stress properties of the channel pattern, the on current of the NMOS transistor and the PMOS transistor may not be the same. In this case, since the first and second nanowire patterns 108b and 112b provided as the channel patterns of the first and second MOS transistors may have different capacities, the on current of each of the first and second MOS transistors may be controlled, respectively.

Particularly, the on current may be increased by forming a MOS transistor of a certain conductivity type through which relatively small amount of the on current may flow at the first nanowire pattern 108b. In addition, a MOS transistor of a certain conductivity type through which relatively a large amount of the on current may flow may be formed at the second nanowire pattern 112b. As described above, first and second MOS transistors having different conductivity types and having the same on current properties may be formed without enlarging a horizontal area occupied by a semiconductor device, respectively.

Particularly, the hole mobility may be greater than the electron mobility for the nanowire pattern formed by using single crystalline silicon having no strain properties. In addition, when each of the NMOS transistor and the PMOS transistor may be formed at the nanowire pattern formed by using compressive strained silicon, compressive strain may be applied to each of the channels, and the on current of the PMOS transistor may be increased further and the on current of the NMOS transistor may be decreased further. Thus, the on current of the NMOS transistor may be required to be increased so that the on current of each of the MOS transistors may have the same properties.

When the first and second nanowire patterns 108b and 112b are formed using compressive strained silicon or single crystalline silicon having no strain properties, the first MOS transistor may be formed as the NMOS transistor, and the second MOS transistor may be formed as the PMOS transistor. Thus, the on current of each of the MOS transistors may be controlled to have the same properties.

In accordance with other example embodiments, the first MOS transistor and the second MOS transistor may have the same conductivity type. That is, the first MOS transistor may be a MOS transistor having a relatively large on current, and the second MOS transistor may be a MOS transistor having a relatively small on current.

As described above, MOS transistors having target on current without enlarging a horizontal region occupied by a semiconductor device may be provided in accordance with example embodiments.

Figure 4D:
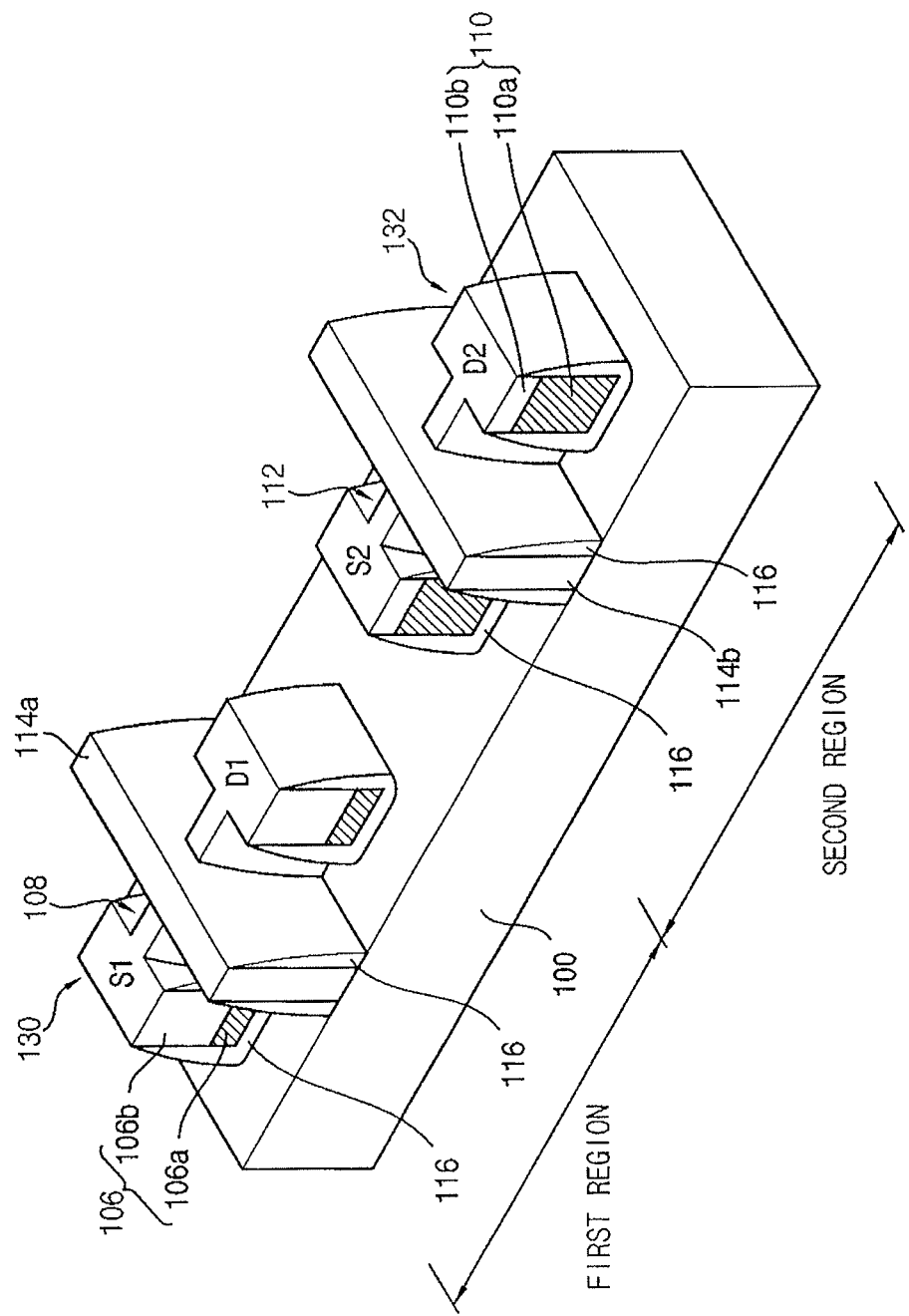

FIGS. 4A to 4I illustrate a first embodiment of a method of manufacturing the semiconductor device in FIG. 1. Referring to FIG. 4A, a substrate 100 is provided which is divided into a first region and a second region. A first semiconductor layer 102 is formed with a first thickness (t1) in the first region and a second thickness (t2) greater than the first thickness (t1) in the second region. In example embodiments, the first region corresponds to a region requiring an increase of the on current of the MOS transistor, and the second region corresponds to a region not requiring an increase of the on current of the MOS transistor. The first semiconductor layer 102 may be formed so as to have a planar upper surface, and a step portion may be formed at the boundary portion of the first and second regions. The first semiconductor layer 102 may be formed by using a first semiconductor material. In example embodiments, the first semiconductor material may use silicon germanium ($Si_{1-x}Ge_x$).

The first thickness (t1) of the first semiconductor layer 102 in the first region may determine a first distance between the substrate 100 and first nanowire pattern to be formed in a following process. In addition, the second thickness (t2) of the first semiconductor layer 102 in the second region may determine a second distance between the substrate and second nanowire pattern to be formed in a following process. Thus, the first distance and second distance may be respectively controlled by controlling the first and second thicknesses t1 and t2 of the first semiconductor layer 102.

The first semiconductor layer 102 may be formed through various methods.

In an example embodiment, a first preliminary semiconductor layer having the second thickness (t2) may be formed on the substrate 100. The first preliminary semiconductor layer may be formed through an epitaxial growing method. The first preliminary semiconductor layer in the first region may be selectively etched to decrease the thickness of the preliminary semiconductor layer positioned in the first region to form the first semiconductor layer 102. In order to form the first semiconductor layer 102, an etching mask pattern covering the first preliminary semiconductor layer in the second region may be formed first, and the first preliminary semiconductor layer may be partially etched by using the etching mask pattern. The etching mask pattern may include a photoresist pattern.

In another example embodiment, a preliminary semiconductor layer having the first thickness (t1) may be formed on the substrate 100. The preliminary semiconductor layer may be formed through an epitaxial growing method. Then, a blocking mask pattern covering the preliminary semiconductor layer positioned in the first region may be formed. An additional semiconductor layer may be grown on the preliminary semiconductor layer in the second region in which the blocking mask pattern may not be formed, to form a semiconductor layer having the second thickness (t2) in the second region. Thus, the first semiconductor layer 102 having different thicknesses in the first and second regions may be formed.

Referring to FIG. 4B, a second preliminary semiconductor layer may be formed on the first semiconductor layer 102. The second preliminary semiconductor layer may be formed by using a second semiconductor material different from the first semiconductor layer 102. The second semiconductor material may be a material having an etching selectivity with respect to the first semiconductor material. In example embodiments, the second semiconductor material may be used for forming first and second nanowire patterns in subsequent processes. In example embodiments, the second semiconductor material may include silicon (Si). When a stacked structure of silicon germanium and silicon is formed, the silicon may become compressive strained silicon by the strain of the silicon germanium. Thus, the first and second nanowire patterns may include compressive strained silicon.

The upper portion of the second preliminary semiconductor layer may be planarized to form a second semiconductor layer 104 having a planar upper surface. The second semiconductor layer 104 may have a third thickness (t3) in the first region and a fourth thickness (t4) smaller than the third thickness (t3) in the second region. The third thickness (t3) may be greater than the first thickness (W. The planarization process may include a chemical mechanical polishing or an etch back process.

In example embodiments, the second semiconductor layer may be provided as first and second nanowire patterns, respectively, through subsequent processes. In the second semiconductor layer 104, the third thickness (t3) may determine the first vertical length of the cross-section of the first nanowire pattern, and the fourth thickness (t4) may determine the second vertical length of the cross-section of the second nanowire pattern. Thus, the vertical length of the first and second nanowire patterns formed in the first and second regions may be controlled by controlling the thickness of the second semiconductor layer 104. In addition, the on current of the first and second MOS transistors formed in the first and second nanowire patterns may be controlled.

Referring to FIG. 4C, through patterning the first and second semiconductor layers 102 and 104, first and second preliminary active structures 130 and 132 may be respectively formed in the first and second regions. Thus, the first and second preliminary active structures 130 and 132 may have a stacked shape of the first and second semiconductor layers 102 and 104. The first and second preliminary active structures 130 and 132 may be structures for forming the channel regions and the source/drain regions of the MOS transistors.

The first preliminary active structure 130 may include a first nanowire structure 108 and a first semiconductor structure 106 provided at both end portions of the first nanowire structure 108 and provided as the source/drain regions of the first MOS transistor. The second preliminary active structure 132 may include a second nanowire structure 112 and a second semiconductor structure 110 provided at both end portions of the second nanowire structure 112 and provided as the source/drain regions of the second MOS transistor.

The first nanowire structure 108 may have an extended lengthwise shape in the first direction. The first direction may be the channel length direction of the first MOS transistor. The cross-section of the first nanowire structure 108 may have a first width (W1) in a horizontal direction. The first width (W1) may be decreased to the line width limit of a process for the integration of a semiconductor device. For example, the first width (W1) may be from a few nm to hundreds of nm degree, and more particularly, may be from about 7 nm to about 40 nm.

The upper planar surface of the second nanowire structure 112 may have the same shape as the upper planar surface of the first nanowire structure 108. Thus, the second nanowire structure 108 may have the first width (W1).

The horizontal direction lengths in the first direction of the first and second nanowire structures 108 and 112 may be the same. Alternatively, the horizontal lengths in the first direction of the first and second nanowire structures 108 and 112 may be different from each other.

In addition, the first semiconductor structure 106 may have a second width (W2) greater than the first width (W1) of the first nanowire structure 108. The first semiconductor structure 106 may have a stacked shape of a first semiconductor pattern 106a and a second semiconductor pattern 106b. The second semiconductor structure 110 may have a third width (W3) greater than the first width (W1) of the second nanowire structure 112. The second and third widths (W2 and W3) may be the same or different. The second semiconductor structure 110 may have a stacked structure of a third semiconductor pattern 110a and a fourth semiconductor pattern 110b.

Referring to FIG. 4D, a dummy gate layer covering the substrate 100 and first and second active structures 130 and 132 may be formed. The dummy gate layer may include a material having an etching selectivity with respect to an insulating interlayer formed in following processes. The dummy gate layer may also include a material having an etching selectivity with respect to an insulating spacer formed in following processes. The dummy gate layer may include a polysilicon material.

After forming the dummy gate layer, a planarization process may be performed on the upper surface of the dummy gate layer. After the planarization, the dummy gate layer may be required to have a thickness sufficiently covering the first and second preliminary active structures 130 and 132.

After forming the dummy gate layer, the dummy gate layer may be patterned to form first and second dummy gate patterns 114a and 114b. The first and second dummy gate patterns 114a and 114b may define portions for forming the gate electrodes of the first and second MOS transistors in following processes. Thus, the first dummy gate pattern 114a may have a traversing shape of the first nanowire structure 108. The second dummy gate pattern 114b may have a traversing shape of the second nanowire structure 112.

An insulating spacer layer may be formed along the surface of the first and second dummy gate patterns 114a and 114b, the first and second preliminary active structures 130 and 132, and the substrate 100. Then, the insulating spacer layer may be anisotropically etched to form an insulating spacer 116 on each of the side walls of the first and second dummy gate patterns 114a and 114b, and the first and second preliminary active structures 130 and 132.

Then, impurities may be doped into the surface portions of the first and second preliminary active structures 130 and 132, exposed through respective sides of the first and second dummy gate patterns 114a, to form impurity regions. By performing the above-described processes, first source/drain regions S1 and D1 may be formed in the first preliminary active structure 130, and second source/drain regions S2 and D2 may be formed in the second preliminary active structure 132. In this case, the impurity regions formed in the first and second nanowire structure 108 may become source/drain extension regions, and the impurity regions formed in the first and second semiconductor structures 106 and 110 may become source/drain regions.

According to the conductivity type of the MOS transistors formed in the first and second regions, the conductivity type of the impurities doped into the first and second preliminary active structures 130 and 132 may be the same or different. That is, the impurities doped into the first and second preliminary active structures 130 and 132 may have different conductivity types or the same conductivity type.

Figure 4E:
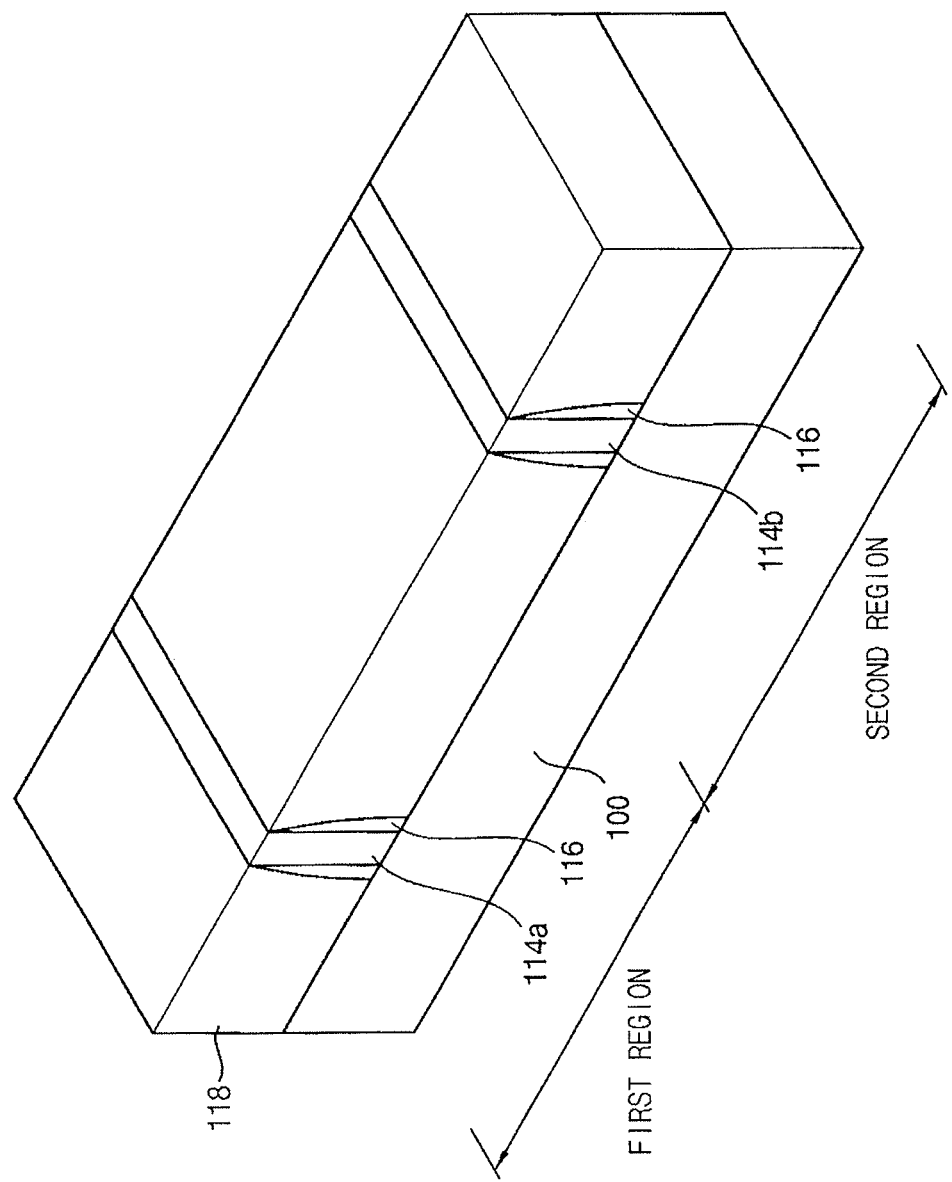

Referring to FIG. 4E, an insulating interlayer 118 may be formed to cover the first and second preliminary active structures 130 and 132, and the first and second dummy gate patterns 114a and 114b may be formed on the substrate 100.

A planarization process may be performed to planarize the upper surface of the insulating interlayer 118. The planarization process may include, for example, a chemical mechanical polishing process. Through the planarization process, the upper surface of the first and second dummy gate patterns 114a and 114b may be exposed.

Referring to FIG. 4F, the first and second dummy gate patterns 114a and 114b may be selectively removed. Through performing the removing process, first and second opening portions 120a and 120b may be formed at the portions including the first and second dummy gate patterns 114a and 114b. A portion of the first and second nanowire structures 108a and 112 may be exposed through the first and second opening portions 120a and 120b.

Referring to FIG. 4G, the first semiconductor layer, positioned under the first and second nanowire structures 108 and 112 exposed by the first and second opening portions 120a and 120b, may be selectively removed. In example embodiments, silicon germanium provided as the first semiconductor layer may be selectively removed. By performing the removing process, only the second semiconductor layer may remain in the first and second opening portions 120a and 120b. Thus, first and second preliminary nanowire patterns 108a and 112a may be formed to be spaced apart from the substrate 100. The removing process may be performed, for example, by an isotropic etching process. Alternatively, the removing process may be performed by dry etching or wet etching.

Through the removing process, only the first semiconductor layer exposed in the first and second opening portions 120a and 120b may be removed. In this case, as illustrated in FIG. 4G, the first and second preliminary nanowire patterns 108a and 112a, which are spaced apart from the substrate, may be formed only in the first and second opening portions 120a and 120b. Alternatively, most of the first semiconductor layer under the first and second nanowire structure may be removed through the removing process. In this case, the first and second nanowire patterns 108b and 112b having the shapes as illustrated in FIG. 2A may be formed.

In the first preliminary active structure 130 in the first region, a relatively thin first semiconductor layer may be formed. In the second preliminary active structure 132 in the second region, a relatively thick first semiconductor layer may be formed. Thus, the distance of the first preliminary nanowire pattern 108a from the substrate may be relatively small, and the first preliminary nanowire pattern 108a may have relatively greater capacity than the second preliminary nanowire pattern 112a. In addition, the second preliminary nanowire pattern 112a may have a relatively large distance from the substrate and may have relatively smaller capacity than the first preliminary nanowire pattern 108a.

Since the first and second semiconductor structures 106 and 110 may be covered with the insulating interlayer, the first and third semiconductor patterns included in the first and second semiconductor structures may not be removed even though performing a selective removing process of the first semiconductor layer at the lower portion. Thus, the first and second semiconductor structures may make direct contact with the substrate 100 and may have a shape supporting the first and second preliminary nanowire patterns 108a and 112a.

Referring to FIG. 4H, a heat treatment process may be performed with respect to the first and second preliminary nanowire patterns 108a and 112a. Through the heat treatment process, the edge portions of the first and second preliminary nanowire patterns 108a and 112a may be rounded to form first and second nanowire patterns 108b and 112b. The heat treatment process may include hydrogen annealing, a thermal oxidation treatment process, or another process. The hydrogen annealing process may not need to be a subsequent treatment process. When the thermal oxidation treatment process is performed, a removing process of an oxide formed on the first and second nanowire patterns 108b and 112b may be further performed. Through performing the heat treatment process, the edge portions of the first and second nanowire patterns 108b and 112b may be rounded, and the concentration of electric field onto the edge portions may be decreased. In other embodiments, the heat treatment process may be omitted for purposes of simplifying the overall process.

When examining only the first and second nanowire patterns 208b and 112b, and the first and second semiconductor structures 106 and 110 excluding the insulating interlayer and the spacer portion, the structure illustrated in FIG. 2A or 2B may be obtained according to the etching degree of the first semiconductor layer.

As illustrated in FIG. 3, the cross-section of the first nanowire pattern 108b may have an elliptical shape or a longitudinal rectangular shape in the second direction. In the cross-section of the first nanowire pattern 108b, a maximum width in a horizontal direction may be the first width (W1). The maximum length in the cross-section of the first nanowire pattern 108b in the vertical direction may be the same as the third thickness. In the vertical-section of the first nanowire pattern 108b, a maximum length in the vertical direction may be called as a first vertical length (H1). In the first nanowire pattern 108b, the vertical length may have an extended shape longer than the first width (W1).

In addition, the cross-section of the second nanowire pattern 112b may have an elliptical shape, a circular shape, or a rectangular shape, having a smaller width in the vertical direction than the cross-section of the first nanowire pattern 108b. The maximum width of the cross-section of the second nanowire pattern 112b in the horizontal direction may be the first width (W1). The maximum length of the cross-section in the second nanowire pattern 112b in the vertical direction may be the same as the fourth thickness. The maximum length in the vertical direction in the vertical-section of the second nanowire pattern 112b may be called as a second vertical length (H2). Thus, the second vertical length (H2) may be smaller than the first vertical length (H1).

Referring to FIG. 4I and FIG. 1 again, first and second gate insulating layers 122a and 122b may be formed on the surface of the first and second nanowire patterns 108b and 112b exposed through the first and second opening portions 120a and 120b, and on the surface of the substrate 100. The first and second gate insulating layers may be, for example, silicon oxide formed through a thermal oxidation process. Alternatively, the first and second gate insulating layers may include a metal oxide having a high dielectric constant, for example, one greater than silicon nitride.

On the first and second gate insulating layers, a gate electrode layer may be formed to completely fill up the first and second opening portions 120a and 120b. The gate electrode layer may include a metal material. Since the gate electrode may be formed by a damascene method, by which conductive materials may be formed in the first and second opening portions 120a and 120b, a metal gate electrode may be formed. Alternatively, the gate electrode layer may include a polysilicon material.

The gate electrode layer formed in the first opening portion 120a and the gate electrode layer formed in the second opening portion 120b may include the same conductive material. Alternatively, the gate electrode layer formed in the first opening portion 120a and the gate electrode layer formed in the second opening portion 120b may include different conductive materials.

Then, the upper portion of the gate electrode layer may be removed to remain the gate electrode layer only in the first and second opening portions 120a and 120b. Through the above-described processes, first and second gate electrodes 124a and 124b may be formed in the first and second opening portions 120a and 120b, respectively.

When examining the first and second nanowire patterns 108b and 112b, the first and second semiconductor structures 106 and 110, and the first and second gate electrodes 124a and 124b excluding the insulating interlayer 118 and the spacer 116, the structure may be the same as that illustrated in FIG. 1.

As illustrated in FIG. 1, the first gate electrode 124a may have a shape surrounding the first nanowire pattern 108b. Particularly, the first gate electrode 124a may have a shape surrounding even the bottom portion of the first nanowire pattern 108b. In addition, the second gate electrode 124b may have a shape surrounding the second nanowire pattern 112b. More particularly, the second gate electrode 124b may have a shape surrounding even the bottom portion of the second nanowire pattern 112b.

As described above, in accordance with example embodiments, MOS transistors having target on currents may be provided by controlling the vertical lengths of the cross-sections of the first and second nanowire patterns without enlarging a horizontal area occupied by a semiconductor device.

Figure 5A:
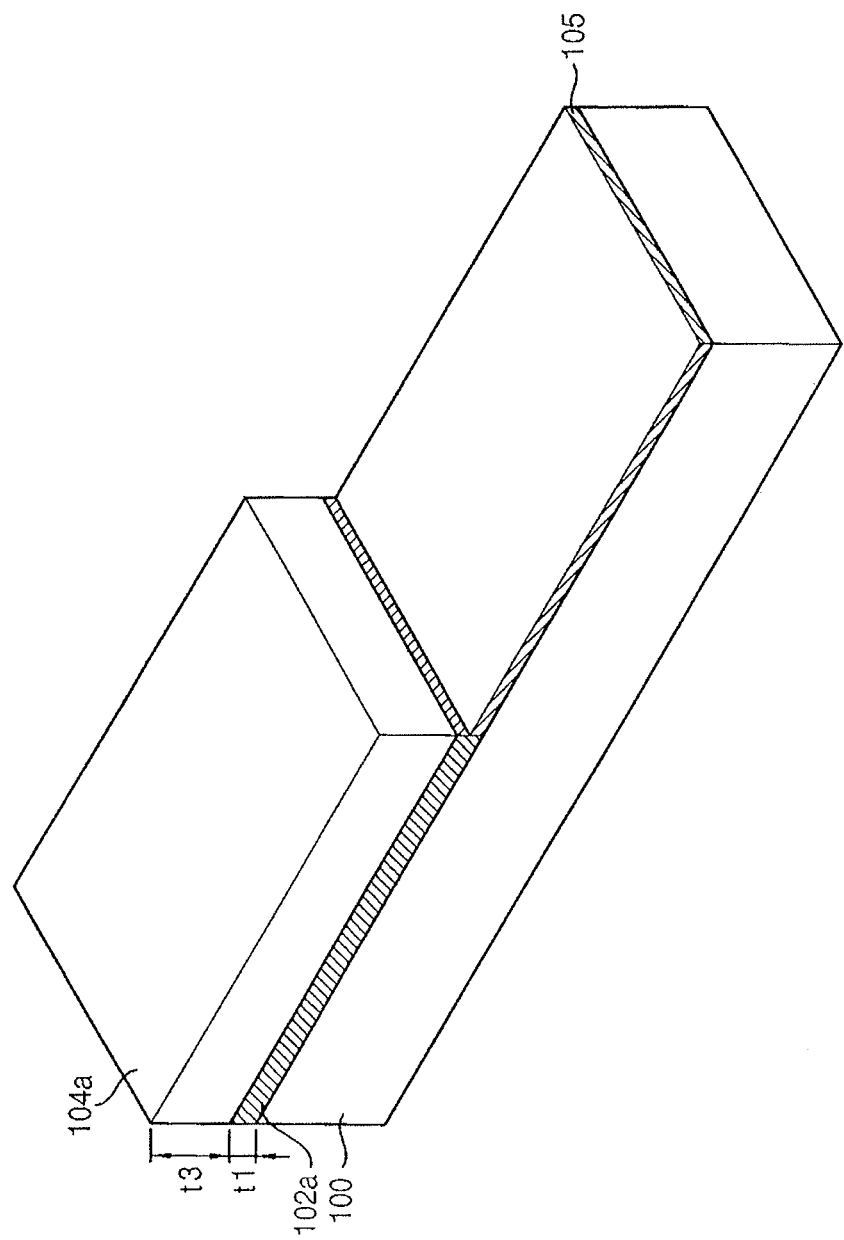
FIGS. 5A and 5B illustrate a second embodiment of a method of manufacturing the semiconductor device in FIG. 1.
Figure 5B:
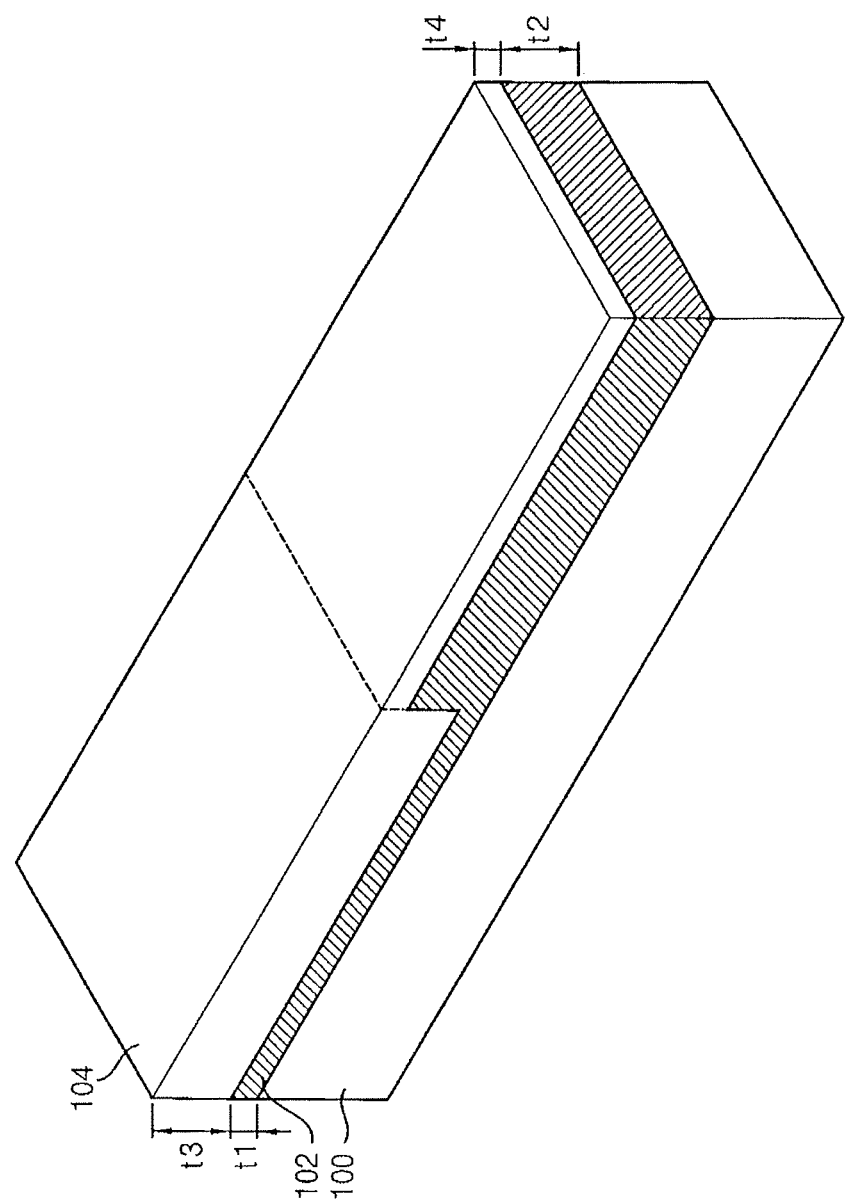

FIGS. 5A and 5B illustrate a second embodiment of a method of manufacturing a semiconductor device in FIG. 1. In the manufacturing method explained herein below, the processes for forming the structure illustrated in FIG. 4B may be different, but the processes explained referring to FIGS. 4C to 4I may be the same.

Referring to FIG. 5A, a substrate 100 may be divided into a first region and a second region. On the substrate 100, a first blocking pattern 105 may be formed to cover the surface portion of the substrate 100 in the second region. The first blocking pattern 105 may include, for example, silicon nitride.

On the exposed portion of the substrate 100 in the first region, a first thin film 102a including a first semiconductor material and having a first thickness may be formed. The first thin film 102a may be formed through a selective epitaxial growing process. The first thin film 102a may include, for example, silicon germanium. Then, a second thin film including a second semiconductor material and having a third thickness greater than the first thickness may be formed on the first thin film 102a. The second thin film 104a may have a thickness greater than the first vertical length of the cross-section of a target first nanowire pattern to be formed in the first region. Then, the first blocking pattern 105 may be removed.

Referring to FIG. 5B, a second blocking pattern may be formed on the second thin film 104a. A third thin film including a first semiconductor material and having a second thickness may be formed on the exposed portion of the substrate in the second region. The third thin film may be formed through a selective epitaxial growing process. The third thin film may include silicon germanium. A fourth thin film having a fourth thickness smaller than the second thickness may be formed by using the second semiconductor material on the third thin film. The fourth thin film may be formed to a thickness greater than the second vertical length of the cross-section of a target second nanowire pattern to be formed in the first region.

Then, the second blocking pattern may be removed. Then, a planarization process may be performed for planarizing the second thin film and the fourth thin film.

Through the above-described processes, first and second semiconductor layers 102 and 104 having the same shape as illustrated in FIG. 4B may be respectively formed. Then, the same processes explained referring to FIGS. 4C to 4I may be performed to manufacture the semiconductor device illustrated in FIG. 1.

FIGS. 6A to 6D illustrate a third embodiment of a method of manufacturing the semiconductor device in FIG. 1. The third method described herein below relates to a method of forming first and second nanowire patterns by using different semiconductor materials from those in the first and second methods.

Figure 6A:
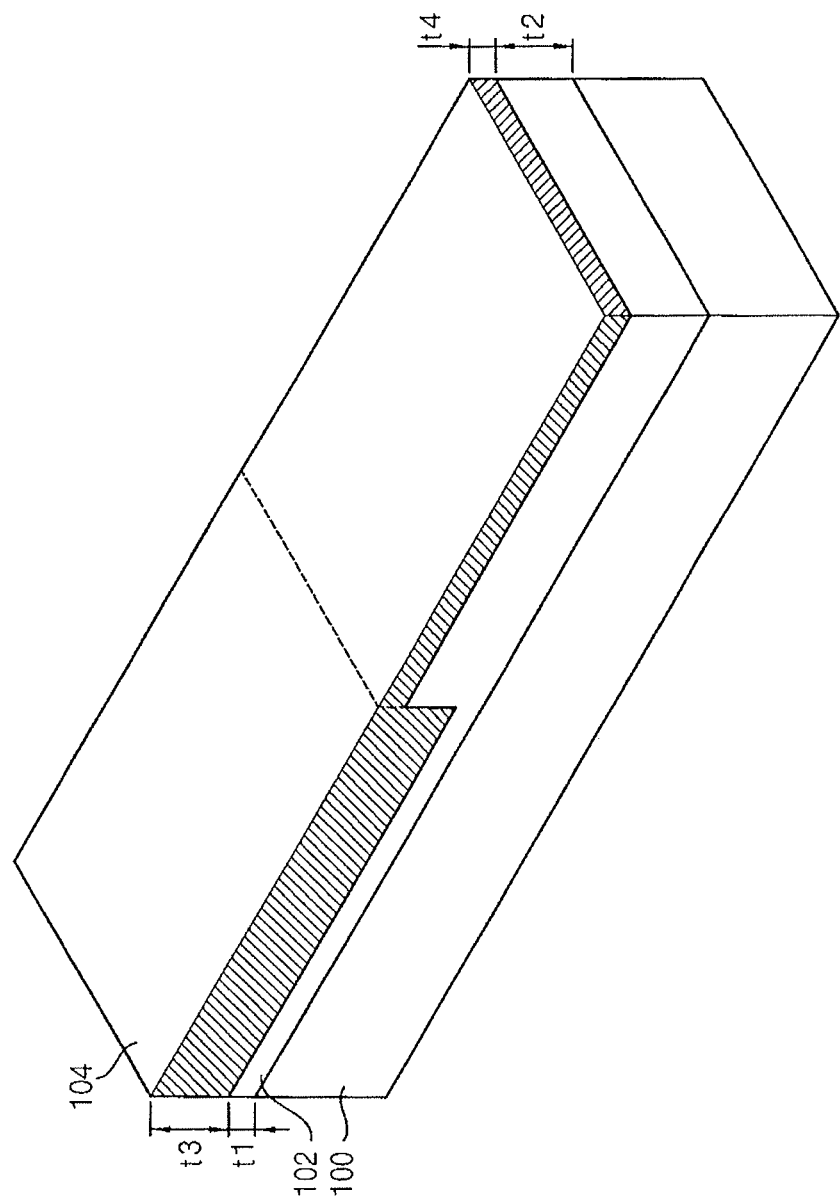

Referring to FIG. 6A, a substrate may be divided into a first region and a second region. On the substrate, a first semiconductor layer 102 including silicon and a second semiconductor layer 104 including silicon germanium may be respectively formed.

The first semiconductor layer 102 formed in the first region may have a first thickness, and the first semiconductor layer 102 formed in the second region may have a second thickness greater than the first thickness. The second semiconductor layer 104 formed in the first region may have a third thickness, and the second semiconductor layer 104 formed in the second region may have a fourth thickness smaller than the third thickness.

Even though the semiconductor material included in the first and second semiconductor layers 102 and 104 may be different from those explained in the first and second methods, the method of forming the first and second semiconductor layers 102 and 104 to the above-described thicknesses may be the same as the first and second methods. That is, the first and second semiconductor layers 102 and 104 may be formed through one method among a method explained referring to FIGS. 4A and 4B and a method explained referring to FIGS. 5A and 5B.

Then, the same processes explained referring to FIGS. 4C to 4G may be performed. Through performing the processes, first and second preliminary nanowire patterns 108a and 112a may be respectively exposed in the first and second opening portions as illustrated in FIG. 6B. In example embodiments, the first and second preliminary nanowire patterns 108a and 112a may be formed by using silicon germanium.

Figure 6C:
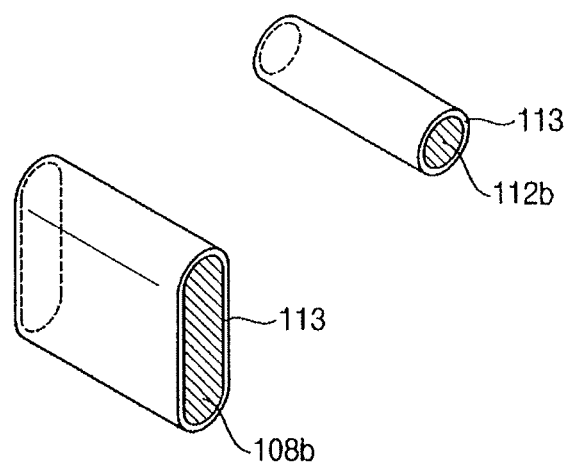
Figure 6D:
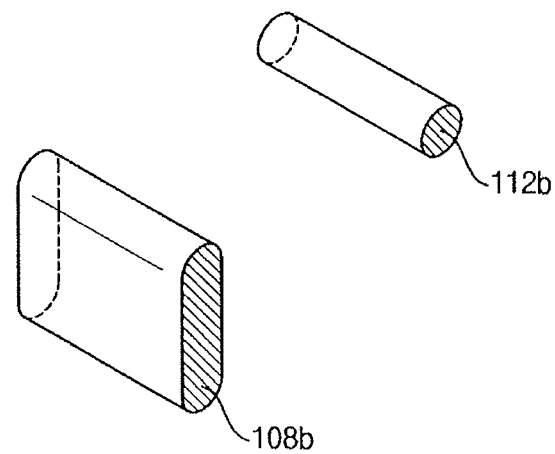

FIGS. 6C and 6D are enlarged views illustrating the first and second preliminary nanowire patterns exposed in the first and second opening portions 120a and 120b.

Referring to FIG. 6C, the first and second preliminary nanowire patterns 108a and 112a exposed in the first and second opening portions 120a and 120b may be thermally oxidized. By performing the thermal oxidation process, silicon component in silicon germanium forming the first and second preliminary nanowire patterns 108a and 112a may be diffused to perform a reaction with oxygen to form silicon oxide 113 on the surface portion. Thus, most of the silicon components in the first and second preliminary nanowire patterns 108a and 112a may be eliminated to form first and second nanowire patterns 108b and 112b, including germanium rich silicon germanium or germanium. In addition, through the oxidation process, the edge portions of the first and second nanowire patterns 108b and 112b may be rounded.

Referring to FIG. 6D, the silicon oxide 113 formed on the surface of the first and second nanowire patterns 108b and 112b may be removed.

By performing the processes, the first and second nanowire patterns 108b and 112b including the germanium rich silicon germanium or the germanium may be formed. The first and second nanowire patterns may have the same shape as illustrated in FIG. 2. Then, the same processes explained referring to FIG. 4I and FIG. 1 may be performed to complete the semiconductor device illustrated in FIG. 1.

Second Embodiment

FIG. 7 illustrates a second embodiment of a semiconductor device which may have almost the same constitution as the semiconductor device in first embodiment, except for the arrangement of the first and second nanowire patterns in a row extending in a horizontal direction, so that the first and second MOS transistors may have multiple channel regions.

Referring to FIG. 7, first nanowire patterns 108b spaced apart from each other in the horizontal direction may be provided in the first region of the substrate 100, and a first MOS transistor may be provided at the first nanowire patterns 108b. In addition, second nanowire patterns 112b spaced apart from each other in the horizontal direction may be provided in the second region of the substrate 100, and a second MOS transistor may be provided at the second nanowire patterns 112b.

Each of the first nanowire patterns 108b provided in the first region of the substrate 100 may have the same constitution as the first nanowire patterns 108b explained referring to FIG. 1. Each of the first nanowire patterns 108b may be arranged in a row in parallel to each other in the horizontal direction. The first nanowire patterns arranged in the row may be provided as the multi channel regions of one of the first MOS transistor.

Each of the second nanowire patterns 112b provided in the second region of the substrate 100 may have the same constitution as the second nanowire patterns 112b explained referring to FIG. 1. Each of the second nanowire patterns 112b may be arranged in a row in parallel to each other in the horizontal direction. The second nanowire patterns 112b arranged in the row may be provided as the multi channel regions of one of the second MOS transistor.

A first semiconductor structure 106 may be provided at respective end portions of the first nanowire patterns 108b arranged in the row. In the first semiconductor structure 106, first source/drain regions S1 and D1 of the first MOS transistor may be provided. In addition, a second semiconductor structure 110 may be provided at respective end portions of the second nanowire patterns 112b arranged in a row. Second source/drain regions S2 and D2 of the second MOS transistor may be provided in the second semiconductor structure 110. The first and second semiconductor structures 106 and 110 may make contact with the surface of the substrate. The stacked structure of the first to fourth semiconductor patterns 106a, 106b, 110a, and 110b included in the first and second semiconductor structures 106 may be the same as those explained referring to FIG. 1.

The first MOS transistor may include a first gate insulating layer 122a, a first gate electrode 124a, and first source/drain regions S1 and D1.

The first gate insulating layer 122a may be provided on the surface of the first nanowire patterns 108b. The first gate electrode 124a may be provided on the first gate insulating layer 122a and may have an extended shape in the second direction while surrounding the first nanowire patterns 108b arranged in a row.

The second MOS transistor may include a second gate insulating layer 122b, a second gate electrode 124b, and second source/drain regions S2 and D2.

The second gate insulating layer 122b may be provided on the surface of the second nanowire patterns 112b. The second gate electrode 124b may be provided on the second gate insulating layer 122b and may have an extended shape in the second direction while surrounding the second nanowire patterns 112b arranged in a row.

As described above, the on current properties of the MOS transistor formed in each region may be controlled by controlling the vertical length of the first and second nanowire patterns 108b and 112b. Particularly, MOS transistors having target on current may be provided without enlarging a horizontal region occupied by a semiconductor device.

In example embodiments, since the first and second nanowire patterns 108b and 112b may be arranged in parallel in the horizontal direction, first and second MOS transistors may have multiple channels in the horizontal direction.

The semiconductor device illustrated in FIG. 7 may be formed by performing almost the same processes explained referring to FIGS. 4A to 4I. In the manufacturing process of the semiconductor device in FIG. 7, only the shape of the first and second preliminary active structures formed through the patterning processes of FIG. 4C may be different.

In a method of manufacturing a semiconductor device illustrated in FIG. 7, processes explained referring to FIGS. 4A and 4B may be performed first. Then, a patterning process may be performed to form first and second preliminary active structures, including a plurality of first and second nanowire structures and the first and second semiconductor structures for connecting the end portions of the plurality of first and second nanowire structures. The upper surface of the first and second preliminary active structures may have the same shapes as the upper surfaces of the first and second nanowire patterns 108b and 112b, and the first and second semiconductor structures 106 and 110.

Then, the processes explained referring to FIGS. 4D to 4I may be performed. By performing the processes, first and second MOS transistors having multiple channels in the horizontal direction may be formed.

Third Embodiment

Figure 8:
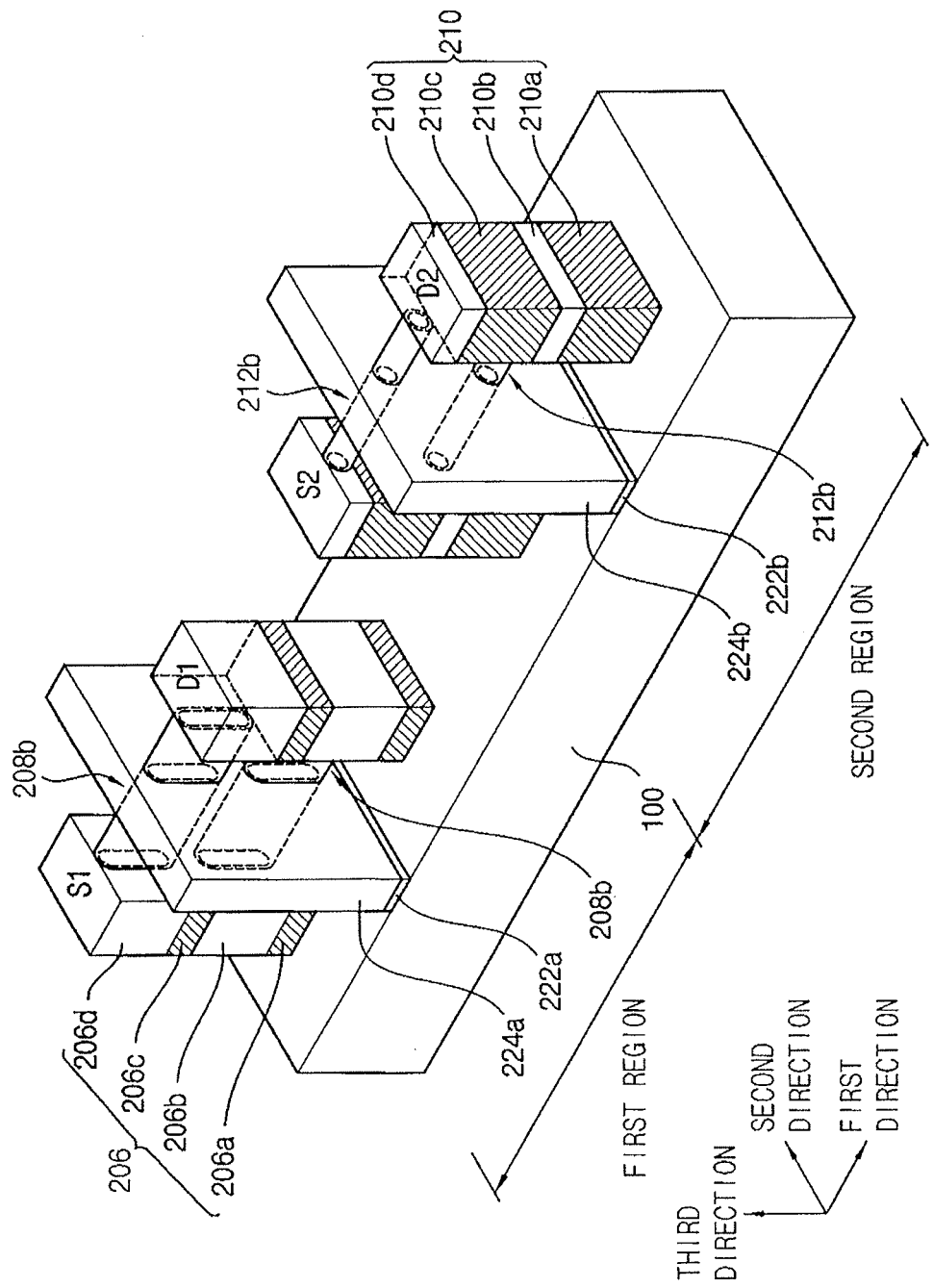
FIG. 8 illustrates a third embodiment of a semiconductor device.

FIG. 8 illustrates a third embodiment of a semiconductor device, which may have almost the same constitution as the semiconductor device in first embodiment except for stacking the first and second nanowire patterns in the third direction so that the first and second MOS transistors may have multiple channel regions.

Referring to FIG. 8, first nanowire patterns 208b spaced apart from each other in the third direction may be provided in the first region of the substrate 100, and a first MOS transistor may be provided at the first nanowire patterns 208b. In addition, second nanowire patterns 212b spaced apart from each other in the third direction may be provided in the second region of the substrate 100, and a second MOS transistor may be provided at the second nanowire patterns 212b.

Each of the first nanowire patterns 208b provided in the first region of the substrate 100 may have the same constitution as the first nanowire patterns 108b explained referring to FIG. 1. Each of the first nanowire patterns 208b may be arranged in parallel to each other in the third direction that may be perpendicular to the surface of the substrate 100. The first nanowire patterns 208b arranged in the vertical direction may be provided as the multi channel regions of one of the first MOS transistor.

Each of the second nanowire patterns 212b provided in the second region of the substrate may have the same constitution as the second nanowire patterns 112b explained referring to FIG. 1. Each of the second nanowire patterns 212b may be arranged in parallel from each other in the third direction that may be perpendicular to the surface of the substrate 100. The second nanowire patterns 212b arranged in the vertical direction may be provided as the multiple channel regions of one of the second MOS transistor.

That is, the first nanowire patterns 208b may have greater capacity than the second nanowire patterns 212b. In addition, in the cross-section of the first nanowire patterns 208b, the first vertical length (H1) may be greater than the second vertical length (H2) in the cross-section of the second nanowire patterns 212b.

The upper surface of the first and second nanowire patterns 212b formed in the same layer may be positioned at the same plane.

A first semiconductor structure 206 may be provided at respective end portions of the first nanowire patterns 212b arranged in the vertical direction. The first source/drain regions S1 and D1 of the first MOS transistor may be provided in the first semiconductor structure 206. The first semiconductor structure 206 may contact the surface of the substrate. The first semiconductor structure 206 may have a stacked shape of alternately stacked first semiconductor and second semiconductor materials.

As shown in FIG. 8, the first semiconductor structure 206 may have a stacked shape of first to fourth semiconductor patterns 206a to 206d. The semiconductor patterns 206a and 206c at odd numbered layers may be formed by using the first semiconductor material, and the semiconductor patterns 206b and 206d at even numbered layers may be formed by using the second semiconductor material.

In the first semiconductor structure 206, the semiconductor patterns 206a and 206c formed by using the first semiconductor material may have a thickness smaller than that of the semiconductor patterns 206b and 206d formed by using the second semiconductor material. In addition, the first nanowire patterns 208b arranged in the vertical direction may have a shape contacting the semiconductor patterns 206b and 206d of the even numbered layers included in the first semiconductor structure.

A second semiconductor structure 210 may be provided at respective end portions of the second nanowire patterns 212b arranged in the vertical direction. The second source/drain regions S2 and D2 of the second MOS transistor may be provided at the second semiconductor structure 210. The second semiconductor structure 210 may contact the surface of the substrate 100. The second semiconductor structure 210 may have a stacked shape including alternately stacked first semiconductor material and second semiconductor material.

As illustrated in FIG. 8, the second semiconductor structure 210 may have a stacked shape of fifth to eighth semiconductor patterns 210a to 210d. The semiconductor patterns 210a and 210c at odd numbered layers may be formed by using the first semiconductor material, and the semiconductor patterns 210b and 210d at even numbered layers may be formed by using the second semiconductor material. In the second semiconductor structure 210, the semiconductor patterns 210a and 210c formed by using the first semiconductor material may have a thickness greater than that of the semiconductor patterns 210b and 210d formed by using the second semiconductor material. In addition, the second nanowire patterns 212b arranged in the vertical direction may have a shape contacting the semiconductor patterns 210b and 210d of the even numbered layers included in the second semiconductor structure.

The first MOS transistor may include a first gate insulating layer 222a, a first gate electrode 224a and first source/drain regions S1 and D1. The first gate insulating layer 222a may be provided on the surface of the first nanowire patterns 208b. The first gate electrode 224a may be provided on the first gate insulating layer 222a and may have an extended shape in the second direction while surrounding the first nanowire patterns 208b arranged in the vertical direction.

The second MOS transistor may include a second gate insulating layer 222b, a second gate electrode 224b and second source/drain regions S2 and D2.

The second gate insulating layer 222b may be provided on the surface of the second nanowire patterns 212b. The second gate electrode 224b may be provided on the second gate insulating layer 222b and may have an extended shape in the second direction while surrounding the second nanowire patterns 212b arranged in the vertical direction.

As described above, the on current properties of a MOS transistor formed in each region may be controlled by controlling the vertical length of the first and second nanowire patterns 208b and 212b. Particularly, MOS transistors having target on currents without enlarging a horizontal region occupied by a semiconductor device may be provided.

In addition, in example embodiments, since the first and second nanowire patterns 208b and 212b may be arranged in parallel in the third direction that may be perpendicular to the surface of a substrate 100, first and second MOS transistors having multiple channels may be provided without enlarging a region in the horizontal direction.

Figure 9B:
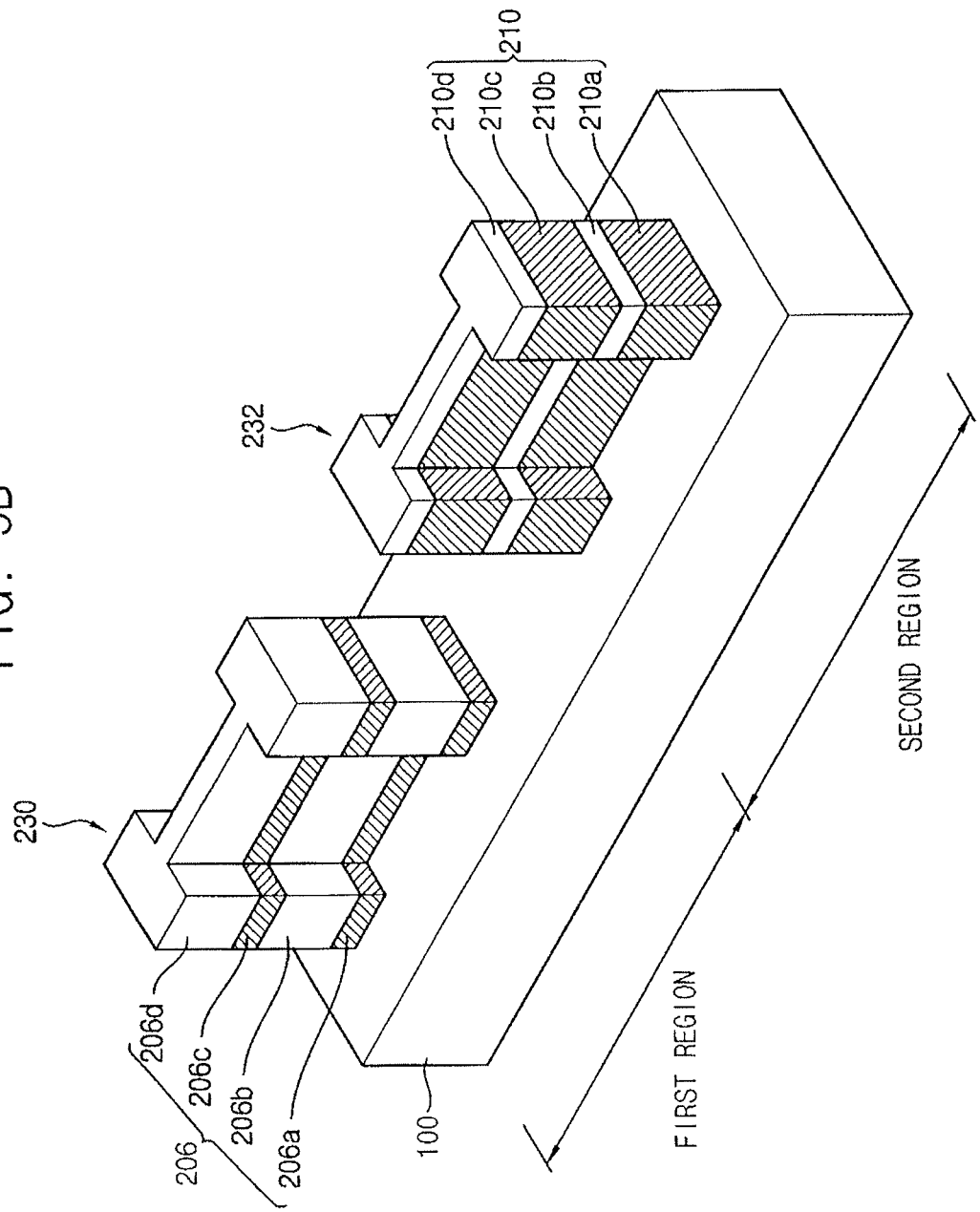

FIGS. 9A to 9C illustrate an embodiment of a method of manufacturing the semiconductor device in FIG. 8. Referring to FIG. 9A, a substrate 100 may be provided which is divided into a first region and a second region. A first semiconductor layer 202a having a first thickness (t1) may be formed in the first region and a second thickness (t2) greater than the first thickness may be formed in the second region. The first semiconductor layer 202a may include a first semiconductor material.

On the first semiconductor layer 202a, a second semiconductor layer 204a having a third thickness (t3) in the first region and a fourth thickness (t4) greater than the third thickness (t3) in the second region may be formed. The third thickness (t3) may be greater than the first thickness (t1). The second semiconductor layer 204a may include a second semiconductor material.

The processes may be performed referring to FIGS. 4A and 4B. Alternatively, the processes may be performed referring to FIGS. 5A and 5B.

Then, a third semiconductor layer 202b having a fifth thickness in the first region and a sixth thickness greater than the fifth thickness in the second region may be formed on the second semiconductor layer 204a. The third semiconductor layer 202b may include the first semiconductor material.

A fourth semiconductor layer 204b having a seventh thickness in the first region and an eighth thickness greater than the seventh thickness in the second region may be formed on the third semiconductor layer 202b.

The second and fourth semiconductor layers 204a and 204b may be provided as first nanowire patterns and second nanowire patterns arranged in the vertical direction through subsequent processes. The vertical length of the first and second nanowire patterns may be controlled by controlling the thickness of the second and fourth semiconductor layers 204a and 204b. In addition, the distance between the first nanowire patterns in the vertical direction and the distance between the second nanowire patterns in the vertical direction may be controlled according to the thicknesses of the first and third semiconductor layers 202a and 202b.

The stacked structure of the third and fourth semiconductor layers 202b and 204b may be the same as the stacked structure of the first and second semiconductor layers 202a and 204a. In addition, the third and fourth semiconductor layers 202b and 204b may be formed by the same method as that of the first and second semiconductor layers 202a and 204a.

Referring to FIG. 9B, the first to fourth semiconductor layers 202a, 204a, 202b and 204b may be patterned to form first and second preliminary active structures 230 and 232, respectively in the first and second regions. Thus, the first and second preliminary active structures 230 and 232 may have a stacked structure of the first to fourth semiconductor layers. The first and second preliminary active structures 230 and 232 may be structures for forming the channel region and source/drain regions of MOS transistors.

The upper surface of the first preliminary active structure 230 may have the same upper surface shape of the first preliminary active structure 130 illustrated in FIG. 4C. In addition, the upper surface of the second preliminary active structure 232 may have the same upper surface shape of the second preliminary active structure 132 illustrated in FIG. 4C.

Referring to FIG. 9C, a dummy gate layer covering the substrate 100, the first and second preliminary active structures 230 and 232 may be formed. After forming the dummy gate layer, the dummy gate layer may be patterned to form first and second dummy gate patterns 214a and 214b. An insulating spacer 216 may be formed on the side wall of the first and second dummy gate patterns 214a and 214b, and the first and second preliminary active structures 230 and 232.

Then, impurities may be doped into the surface portion of the first and second preliminary active structures 230 and 232 exposed through respective sides of the first and second dummy gate patterns 214a and 214b to form impurity regions. First source/drain regions S1 and D1 may be formed in the first preliminary active structure, and second source/drain regions S2 and D2 may be formed in the second preliminary active structure.

The conductivity type of the doped impurities into the first and second preliminary active structures 230 and 232 may be different according to the conductivity type of the MOS transistor formed in the first and second regions. The impurities doped into the first and second preliminary active structures 230 and 232 may have different conductivity types or the same conductivity type.

Then, the processes explained referring to FIGS. 4E to 4I may be performed to form the semiconductor device illustrated in FIG. 8.

Through performing the above processes, first and second MOS transistors having multi channels may be formed without enlarging a region in the horizontal direction.

Fourth Embodiment

Figure 10:
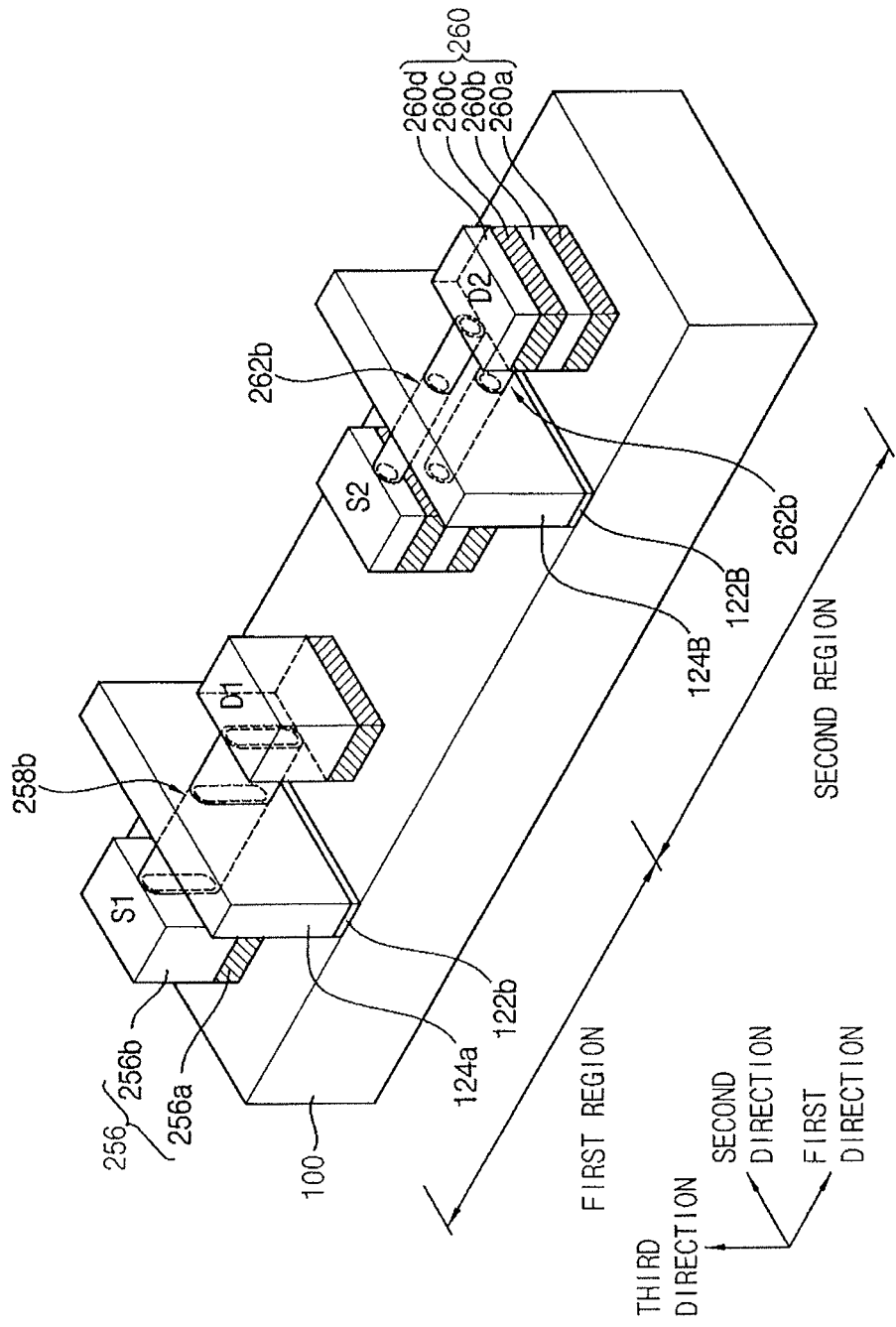
FIG. 10 illustrates a fourth embodiment of a semiconductor device.
Figure 11:
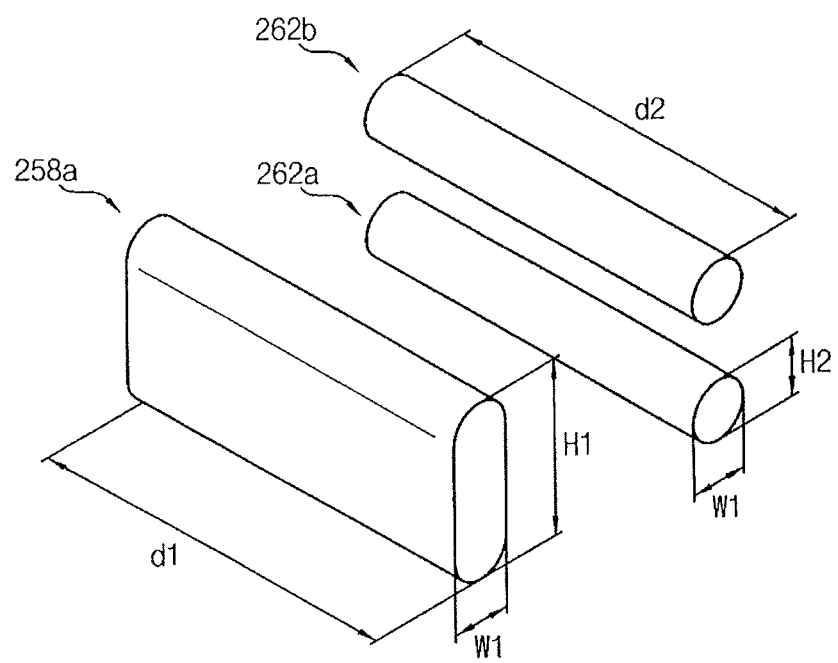
FIG. 11 illustrates an example of first and second nanowire patterns in FIG. 10.

FIG. 10 illustrates a fourth embodiment of a semiconductor device, and FIG. 11 is a perspective view illustrating first and second nanowire patterns in FIG. 10. The first and second MOS transistors in the semiconductor device illustrated in FIG. 10 may include different numbers of nanowire patterns from each other. In addition, the second MOS transistor may have a multiple channel structure in which nanowire patterns may be stacked in the third direction.

Referring to FIGS. 10 and 11, a first nanowire pattern 258b spaced apart from the substrate may be provided in the first region of the substrate 100, and the first MOS transistor may be provided at the first nanowire pattern 258b. In addition, second nanowire patterns 162b spaced apart from each other in the vertical direction may be provided in the second region of the substrate 100, and the second MOS transistor may be provided at the second nanowire patterns 262b.

The first nanowire pattern 258b provided in the first region of the substrate may have the same constitution as the first nanowire pattern 108b explained in FIG. 1. The second nanowire pattern 262b provided in the second region of the substrate may have the same constitution as the second nanowire pattern 112b explained in FIG. 1. As illustrated in FIG. 11, the first nanowire pattern 258b may have greater capacity than the second nanowire patterns 262b. In addition, the first vertical length (H1) in the cross-section of the first nanowire patterns 258b may be greater than the second vertical length (H2) in the cross-section of the second nanowire patterns 262b.

The second nanowire patterns 262b may be disposed in parallel to each other in the third direction that may be perpendicular to the surface of the substrate. As described above, a greater number of second nanowire patterns 262b may be provided than the first nanowire patterns 258b. For example, in one non-limiting embodiment, the number of the second nanowire patterns 262b may be twice the number of first nanowire patterns 258b.

The upper surface of the first nanowire pattern 258b may be positioned at the same plane as the upper surface of one of the second nanowire patterns 262b.

A first semiconductor structure 256 may be provided at respective end portions of the first nanowire pattern 258b. The first source/drain regions S1 and D1 of the first MOS transistor may be provided in the first semiconductor structure. The first semiconductor structure 256 may contact the surface of the substrate. The first semiconductor structure may have a stacked structure of the first and second semiconductor patterns 256a and 256b. The first nanowire patterns may contact the second semiconductor pattern 256b.

A second semiconductor structure 260 may be provided at respective end portions of the second nanowire patterns 262b disposed in the vertical direction. The second source/drain regions S2 and D2 of the second MOS transistor may be provided in the second semiconductor structure 260. The second semiconductor structure 260 may contact the surface of the substrate. The second semiconductor structure 260 may have a stacked structure in which a first semiconductor material and a second semiconductor material may be alternately stacked.

The second semiconductor structure 260 may have a stacked shape of third to sixth semiconductor patterns 260a to 260d. The second nanowire patterns 262b may have a shape contacting fourth to sixth semiconductor patterns 260b and 260d formed by using the second semiconductor material layer. Thus, the second semiconductor layer 260 may have a different stacked structure from the first semiconductor structure 256.

The first MOS transistor may include a first gate insulating layer 122a, a first gate electrode 124a and first source/drain regions S1 and D1. The second MOS transistor may include a second gate insulating layer 122b, a second gate electrode 124b and second source/drain regions S2 and D2.

By controlling the vertical length of the first and second nanowire patterns 258b and 262b, the on current properties of the MOS transistor formed in each region may be controlled. Particularly, MOS transistors having target on current may be provided without enlarging the horizontal region occupied by a semiconductor device.

Also, in example embodiments, the on current properties may be controlled by disposing different numbers of the stacking layers of the first and second nanowire patterns 258b and 262b. In addition, the second MOS transistors having multiple channels may be provided without enlarging the region in the horizontal region.

Figure 12A:
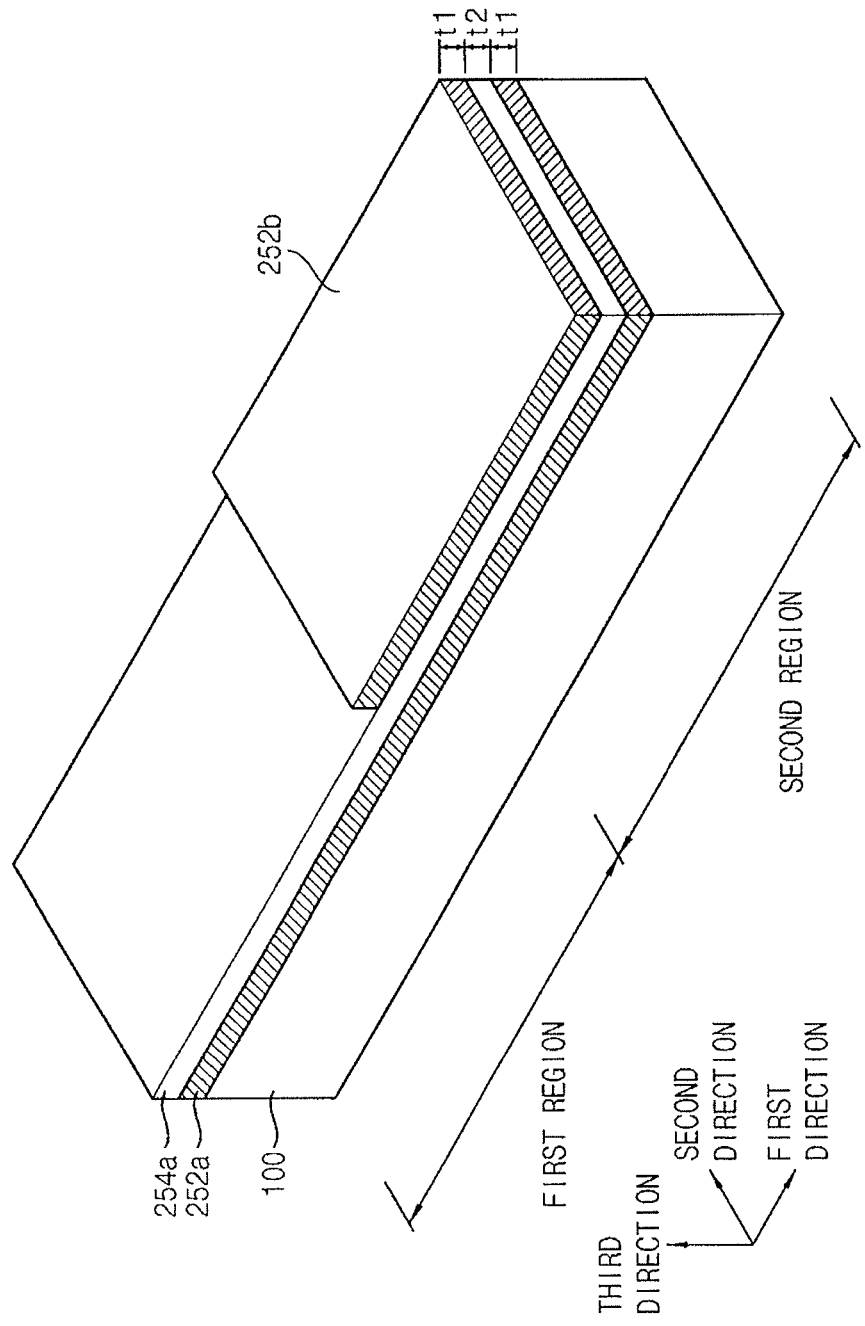
FIGS. 12A to 12C are additional views of the semiconductor device in FIG. 10.
Figure 12B:
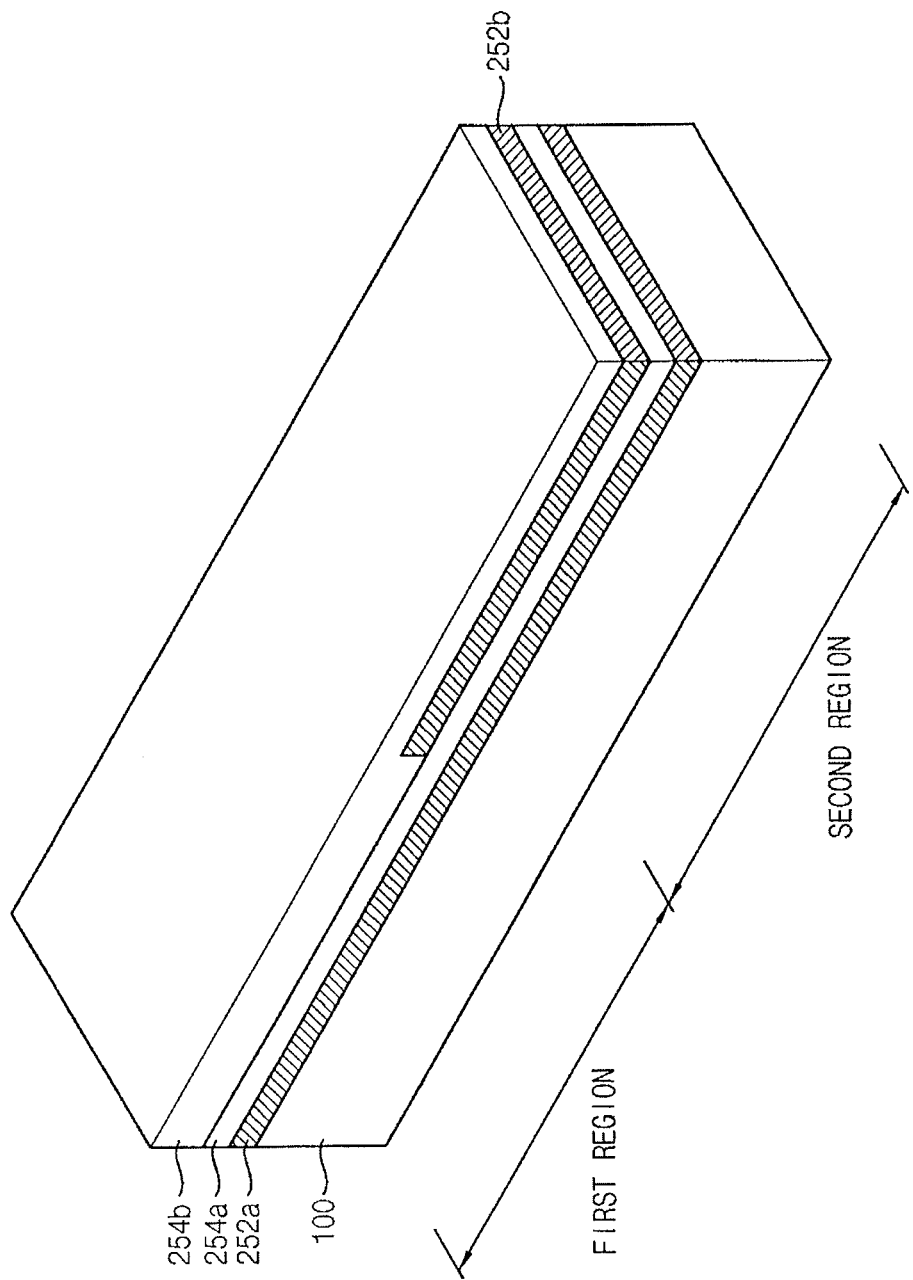
Figure 12C:
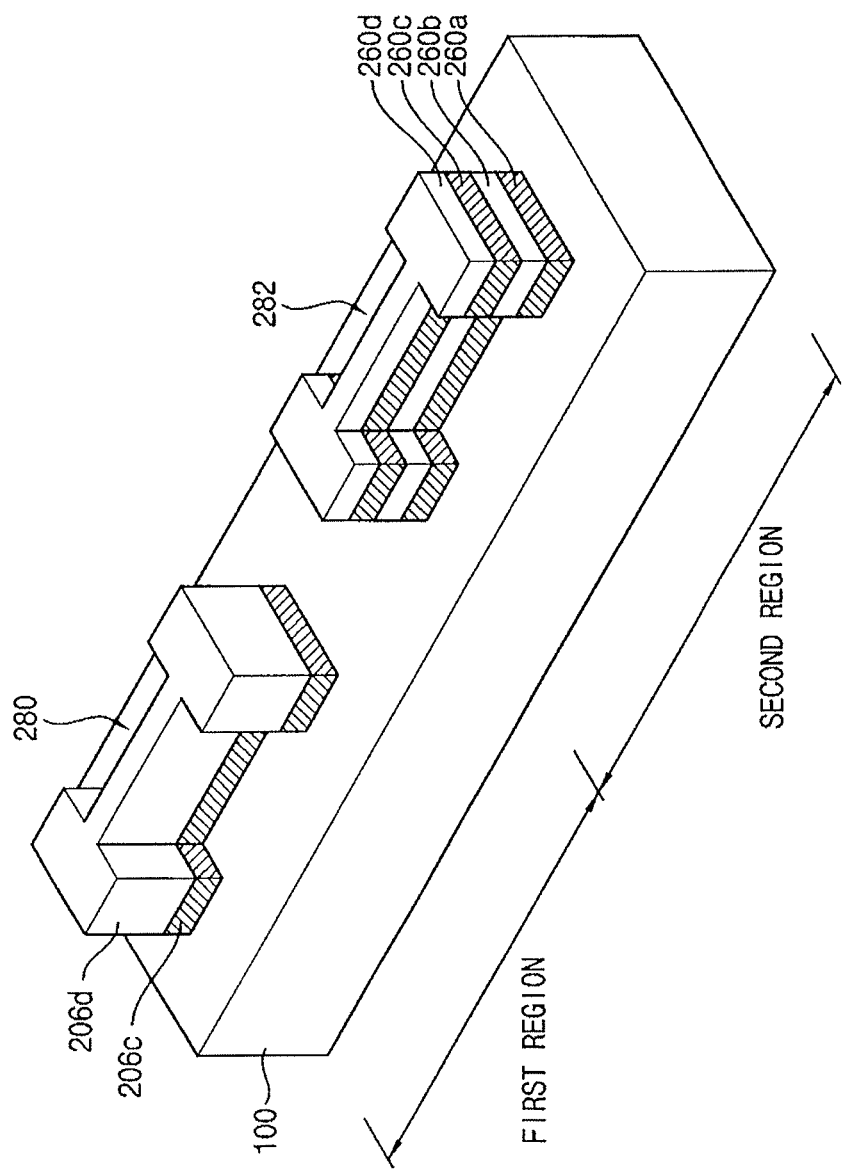

FIGS. 12A to 12C illustrate perspective views of the semiconductor device in FIG. 10. Referring to FIG. 12A, a first semiconductor layer 252a having a first thickness (t1) may be formed on a substrate, which is divided into a first region and a second region. The first semiconductor layer 252a may include a first semiconductor material.

A second semiconductor layer 254a having a second thickness (t2) may be formed on the first semiconductor layer 252a. The second thickness (t2) may be the same as or different from the first thickness (t1). The second semiconductor layer 254a may include a second semiconductor material having an etching selectivity with respect to the first semiconductor material.

A third semiconductor layer 252b having the first thickness (t1) may be formed on the second semiconductor layer 254a positioned in the second region. The third semiconductor layer 252b may include the first semiconductor material. In a method of forming the third semiconductor layer 252b, a blocking pattern may be formed on the second semiconductor layer 254a positioned in the first region. Then, the third semiconductor layer 252b may be formed on the exposed second semiconductor layer 254a in the second region through a selective epitaxial growing process. The blocking pattern may be removed.

Referring to FIG. 12B, a fourth preliminary semiconductor layer may be formed on the second semiconductor layer 254a and the third semiconductor layer 252b. The fourth preliminary semiconductor layer may include the second semiconductor material. The upper portion of the fourth preliminary semiconductor layer may be planarized to form the fourth semiconductor layer 254b having a planar upper surface.

As illustrated, since the second and fourth semiconductor layers 254a and 254b may be formed by using the same semiconductor material, the second and fourth semiconductor layers 254a and 254b may be provided as one layer in the first region. Thus, two semiconductor layers may be stacked in the first region, and four semiconductor layers may be stacked in the second region.

In example embodiments, a portion formed by using the second semiconductor material may be provided as a nanowire pattern. Thus, one of the first nanowire patterns may be formed in the first region, and two of the second nanowire patterns may be formed in the second region. A portion including the first semiconductor material may be partially removed through subsequent processes to be a distance between the nanowires.

Referring to FIG. 12C, the first to fourth semiconductor layers may be patterned to form first and second preliminary active structures 280 and 282 respectively in the first and second regions.

The same processes explained referring to FIGS. 4D to 4I may be performed to complete the semiconductor device illustrated in FIG. 10.

Fifth Embodiment

Figure 13:
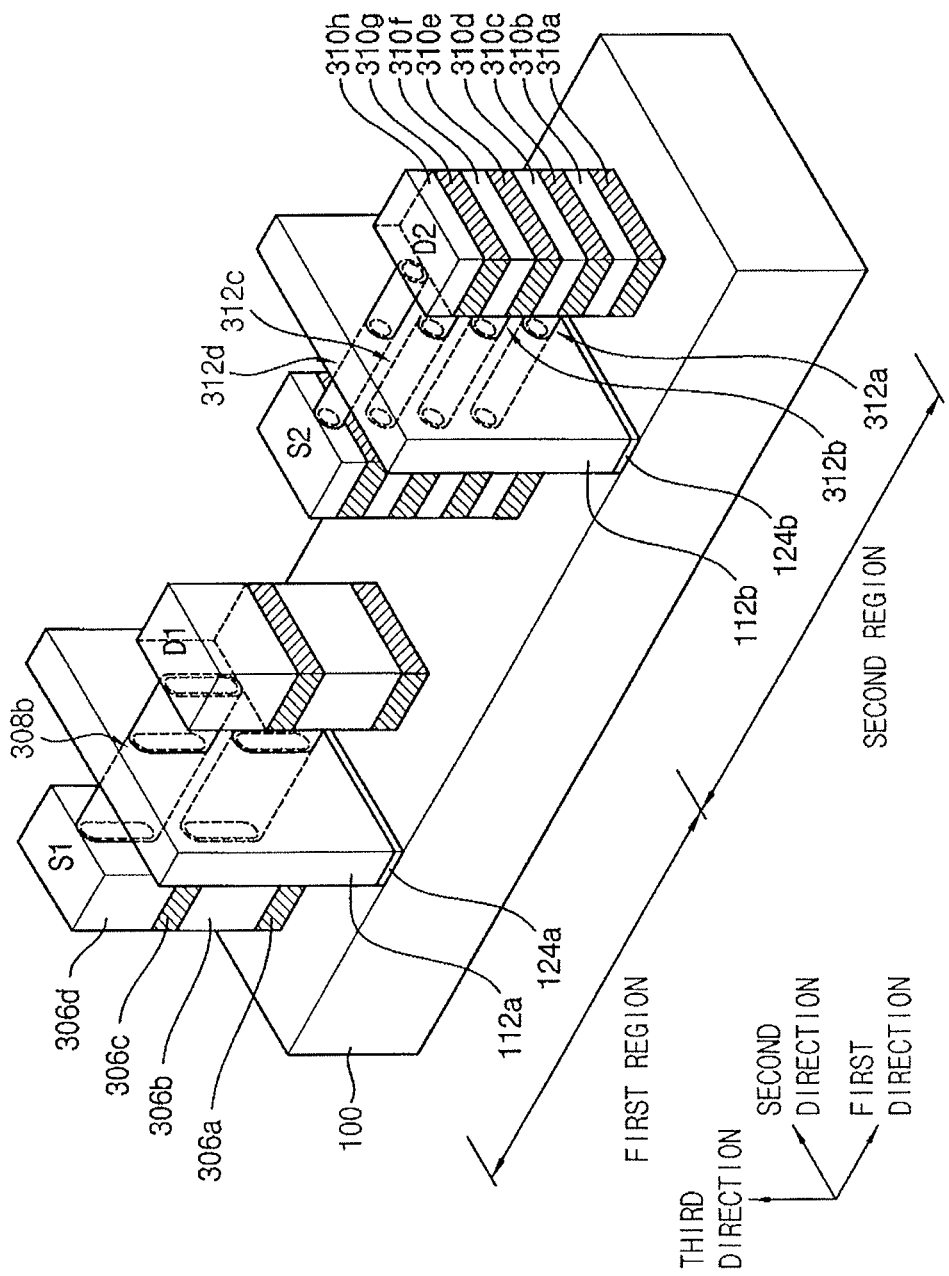
FIG. 13 illustrates a fifth embodiment of a semiconductor device.
Figure 14:
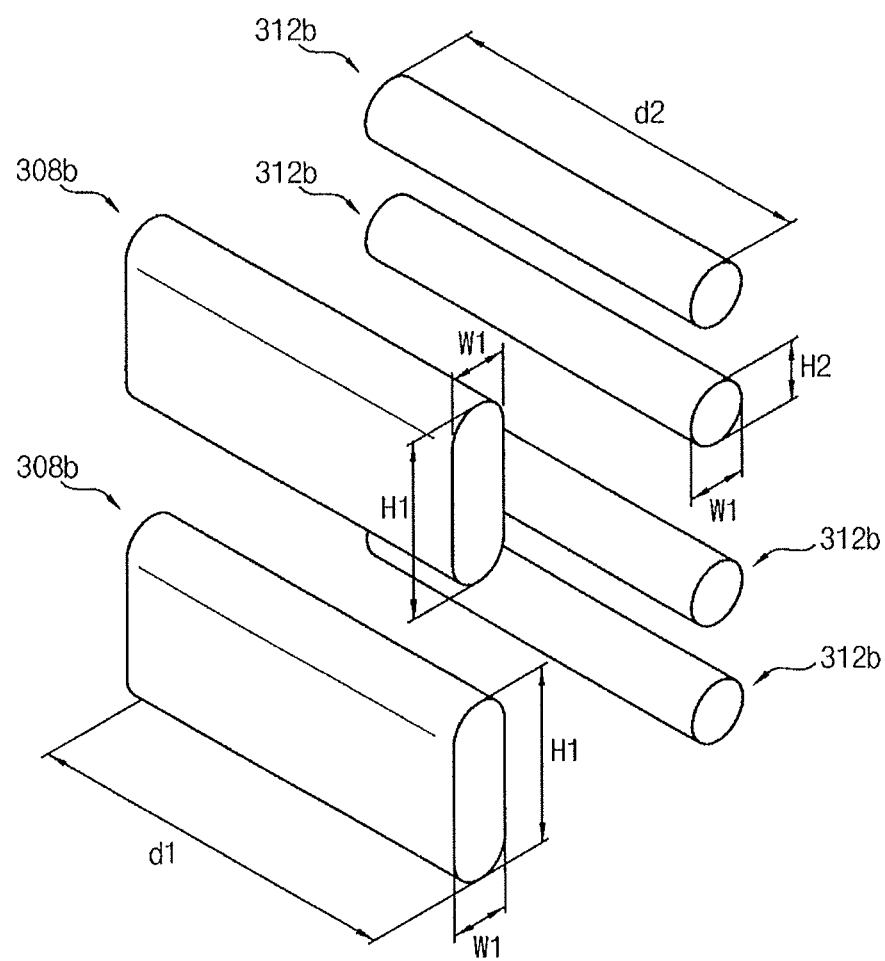
FIG. 14 illustrates an example of first and second nanowire patterns in FIG. 13.

FIG. 13 illustrates a fifth embodiment of a semiconductor device, and FIG. 14 illustrates a perspective view illustrating first and second nanowire patterns in FIG. 13. In the semiconductor device illustrated in FIG. 13, first and second MOS transistors may have a multiple channel structure in which nanowire patterns may be stacked in the third direction.

Referring to FIGS. 13 and 14, first nanowire patterns 308b spaced apart from each other in the vertical direction may be provided in the first region of the substrate 100, and the first MOS transistor may be provided at the first nanowire patterns 308b. Second nanowire patterns 312b spaced apart from each other in the vertical direction may be provided in the second region of the substrate, and the second MOS transistor may be provided at the second nanowire patterns 312b.

The first nanowire patterns 308b provided in the first region of the substrate may have the same constitution as the first nanowire pattern 108b explained referring to FIG. 1. The second nanowire patterns 312b provided in the second region of the substrate may have the same constitution as the second nanowire pattern 112b explained referring to FIG. 1. For example, as illustrated in FIG. 14, the first nanowire pattern 308b may have greater capacity than the second nanowire patterns 312b. The first vertical length (H1) in the cross-section of the first nanowire patterns 308b may be greater than the second vertical length (H2) in the cross-section of the second nanowire patterns 312b.

The first nanowire patterns 308b may be disposed in parallel to each other in the third direction, which may be perpendicular to the surface of the substrate. The second nanowire patterns 312b may be disposed in parallel in the third direction, which may be perpendicular to the surface of the substrate. The same or a different number of first and second nanowire patterns 308b and 312b may not be provided. In one embodiment, the number of second nanowire patterns 312b may be greater than the number of first nanowire patterns 308b.

As described above, the on current properties of the MOS transistor formed in each region may be controlled by controlling the vertical length of the first and second nanowire patterns 308b and 312b. Particularly, the MOS transistors having target on current may be provided without enlarging the horizontal region occupied by a semiconductor device.

Also, in example embodiments, the on current properties may be controlled by disposing the stacking number of the first and second nanowire patterns 308b and 312b differently. The first and second MOS transistors having multiple channels may be provided without enlarging the region in the horizontal direction.

Figure 15A:
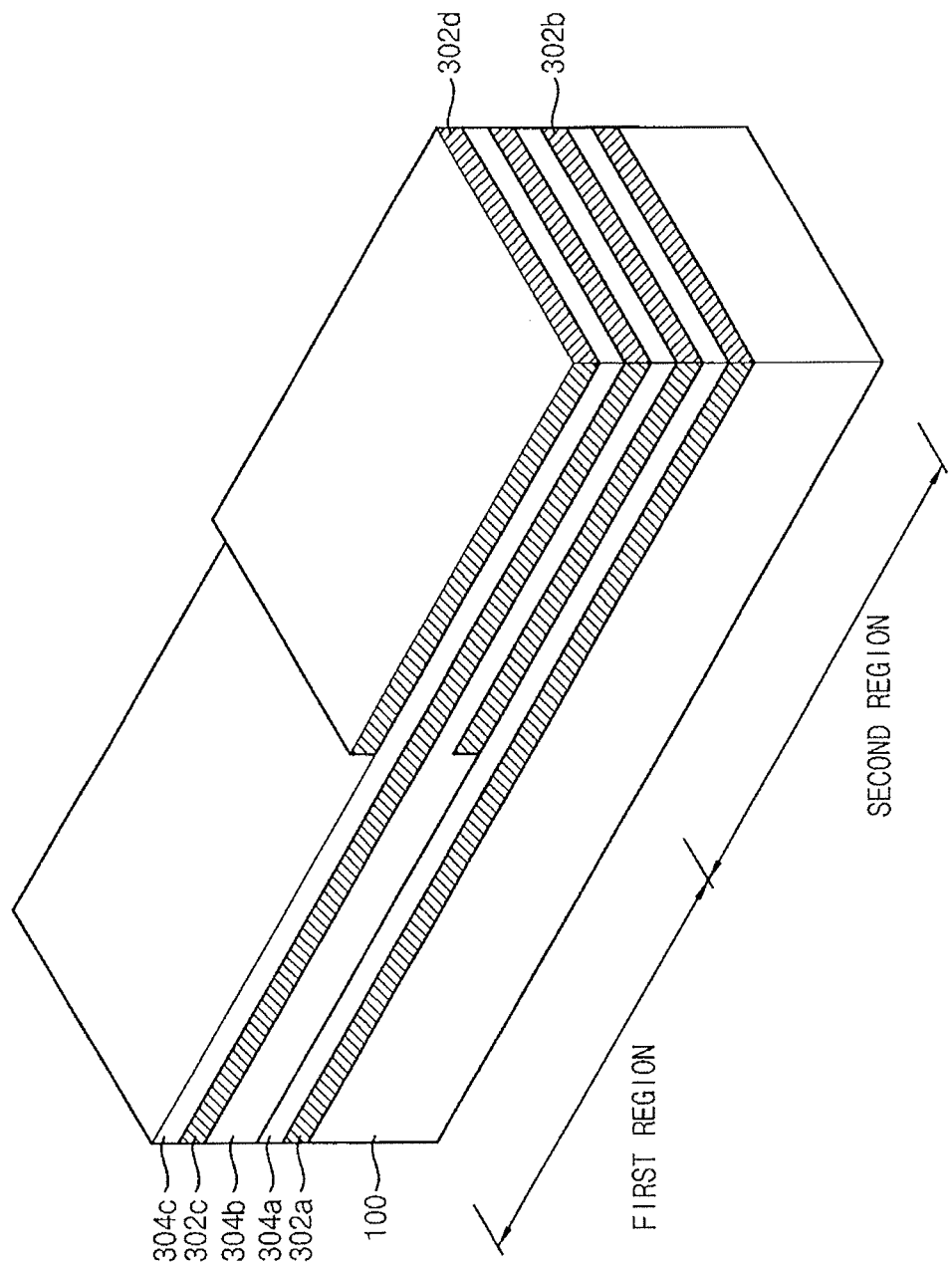

FIGS. 15A to 15C illustrate an embodiment of a method of manufacturing the semiconductor device in FIG. 13. First, the same processes as explained referring to FIGS. 12A and 12B may be performed to form first to fourth semiconductor layers 302a, 304a, 302b, and 304b.

Referring to FIG. 15A, a fifth semiconductor layer 302c having the first thickness may be formed on the fourth semiconductor layer 304b. The fifth semiconductor layer 302c may be formed by using the first semiconductor material. A sixth semiconductor layer 304c having the second thickness may be formed on the fifth semiconductor layer 302c. The sixth semiconductor layer 304c may be formed by using the second semiconductor material. The processes for forming the fifth and sixth semiconductor layers 302c and 304c may be the same as the processes for forming the first and second semiconductor layers in FIG. 12A.

On the sixth semiconductor layer 304c positioned in the second region, a seventh semiconductor layer 302d having the first thickness may be formed. The seventh semiconductor layer 302d may include the first semiconductor material. The processes for forming the seventh semiconductor layer 302d may be the same as the processes for forming the third semiconductor layer 302b in FIG. 12A.

Referring to FIG. 15B, an eighth preliminary semiconductor layer may be formed on the sixth semiconductor layer 304c and the seventh semiconductor layer 302d. The eighth preliminary semiconductor layer may include the second semiconductor material. Then, the upper portion of the eighth preliminary semiconductor layer may be planarized to form an eighth semiconductor layer 304e having a planar upper surface.

As illustrated, four semiconductor layers may be stacked in the first region, and eight semiconductor layers may be stacked in the second region. Also, in example embodiments, a portion formed by using the second semiconductor material may be provided as nanowire patterns. Thus, two of the first nanowire patterns may be formed in the first region, and four of the second nanowire patterns may be formed in the second region. The portion formed by using the first semiconductor material may be partially removed through subsequent processes to provide a distance between nanowire patterns.

Referring to FIG. 15C, the first to eighth semiconductor layers 302a to 302d, and 304a to 304e may be patterned to form first and second preliminary active structures 330 and 332 respectively in the first and second regions.

The same processes explained referring to FIGS. 4D to 4I may be performed to manufacture the semiconductor device illustrated in FIG. 13.

Sixth Embodiment

Figure 16:
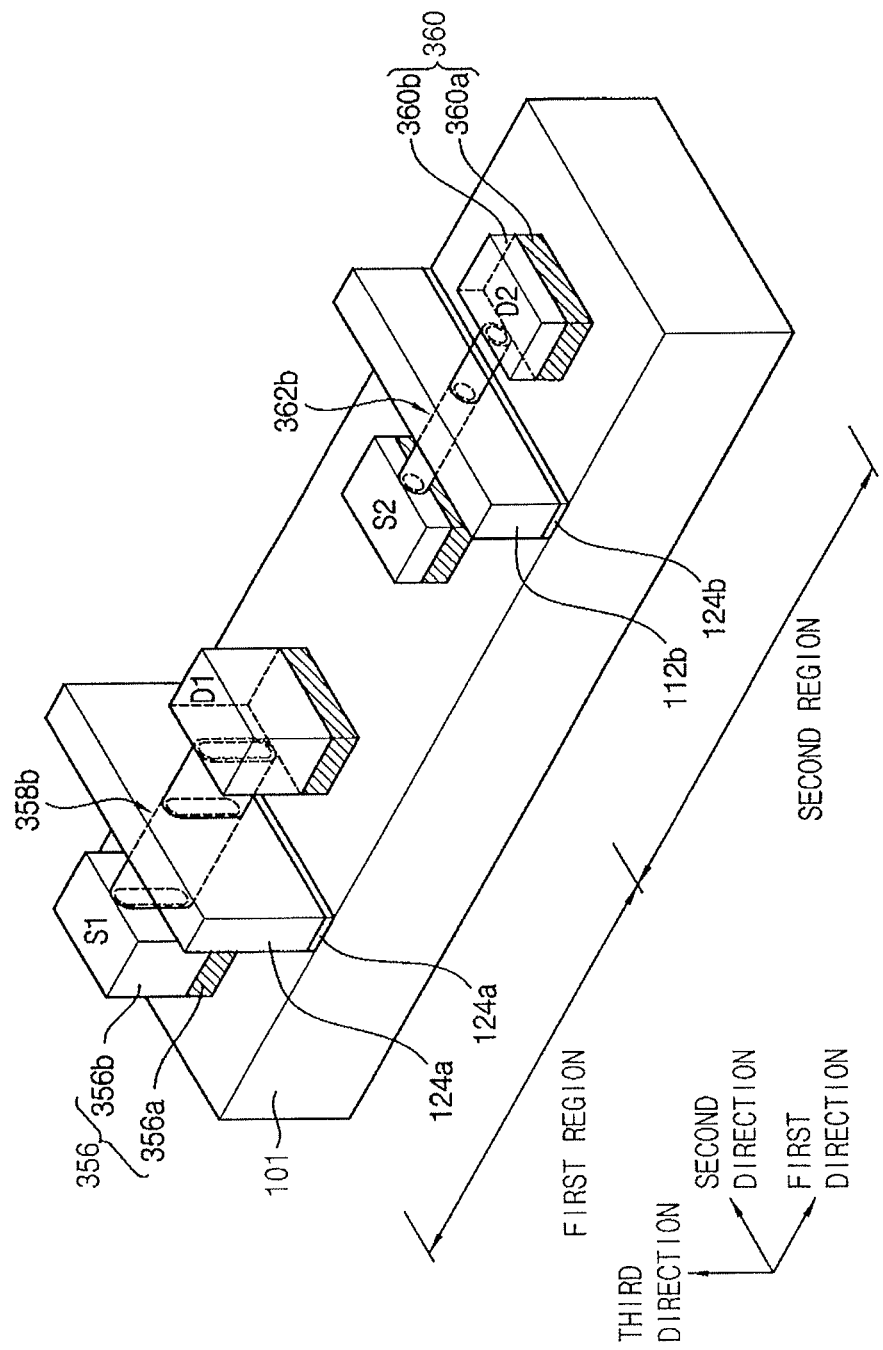
FIG. 16 illustrates a sixth embodiment of a semiconductor device.
Figure 17:
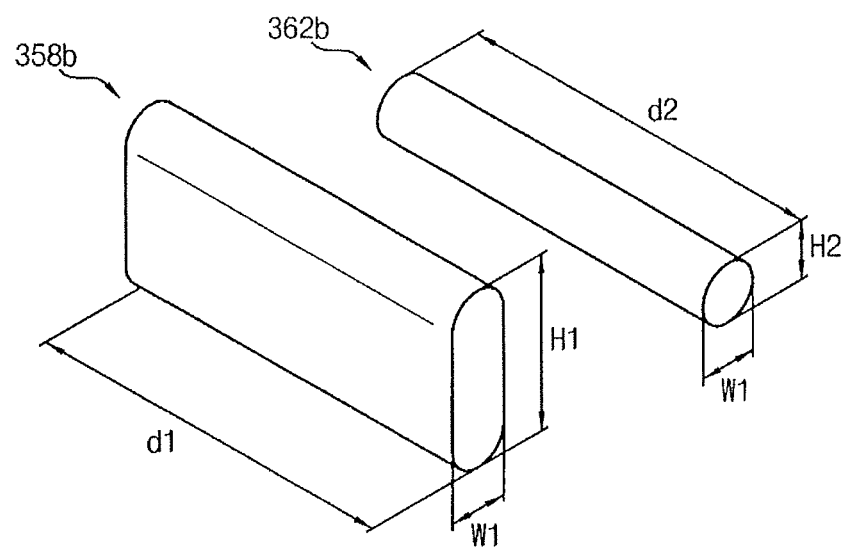
FIG. 17 illustrates an example of first and second nanowire patterns in FIG. 16.

FIG. 16 illustrates a sixth embodiment of a semiconductor device, and FIG. 17 illustrates a perspective view of first and second nanowire patterns in FIG. 16. Referring to FIGS. 16 and 17, a first nanowire pattern 358b may be provided in the first region of a substrate, and a first MOS transistor may be provided at the first nanowire pattern 358b. A second nanowire pattern 362b may be provided in the second region of the substrate, and a second MOS transistor may be provided at the second nanowire pattern 362b.

As illustrated in FIG. 17, the upper surfaces of the first and second nanowire patterns 358b and 362b may be positioned at different planes from each other. The upper surface of the second nanowire pattern 362b may be positioned lower than the upper surface of the first nanowire pattern 358b. Thus, a second semiconductor structure 360 connected to the second nanowire pattern 362b may have a smaller height than a first semiconductor structure 356 connected to the first nanowire pattern 358b.

The first and second nanowire patterns 358b and 362b may have the same shape as the first and second nanowire patterns 108b and 112b as explained in FIG. 1.

The first semiconductor structure 356 may have a stacked structure of a first insulating layer pattern 356a and a first semiconductor pattern 356b. The first nanowire pattern 358b may contact the first semiconductor pattern 356b. The second semiconductor structure 360 may have a stacked structure of a second insulating layer pattern 360a and a second semiconductor pattern 360b. The second nanowire pattern 362b may contact the second semiconductor pattern 360b. The first and second insulating layer patterns 356a and 360a may include, for example, silicon oxide.

Figure 18B:
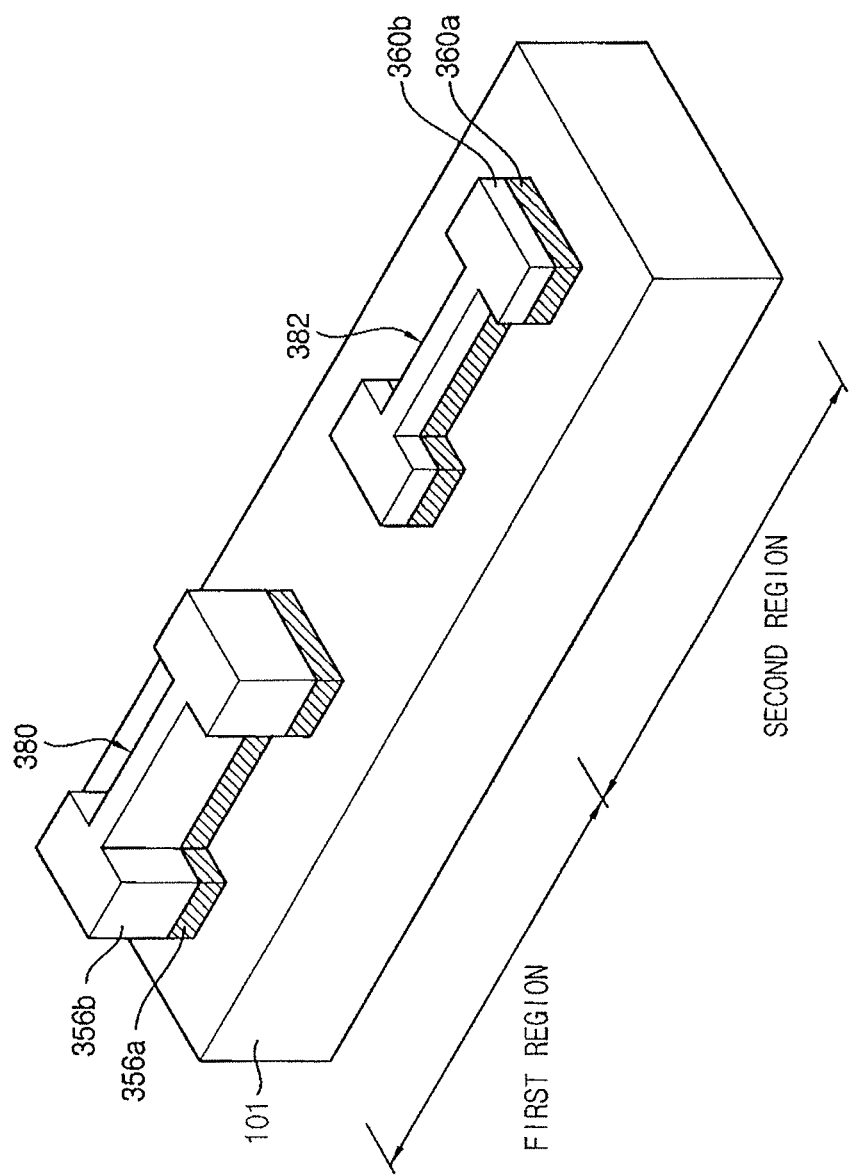

FIGS. 18A and 18B illustrate perspective views of the semiconductor device in FIG. 16. Referring to FIG. 18A, an SOI substrate including a stacked structure of a lower silicon 101, silicon oxide 350a and an upper silicon 352a may be prepared. The SOI substrate may be divided into a first region and a second region. On the SOI substrate, first semiconductor layers 352a and 352b having a first thickness may be formed in the first region and having a second thickness smaller than the first thickness may be formed in the second region. The first semiconductor layers 352a and 352b may include single crystalline silicon.

As illustrated in FIG. 18A, a semiconductor layer 352b may be selectively formed only on the upper surface of the SOI substrate in the first region. Thus, the first semiconductor layer 352a and 352b may include the upper silicon 352a and the semiconductor layer 352b of the SOI substrate.

Alternatively, the first semiconductor layer may be formed by only using the upper silicon 352a without forming a semiconductor layer. In this case, the upper silicon 352a formed in the second region may be partially etched to a certain thickness to form the first semiconductor layer.

The first semiconductor layers 352a and 352b may be formed on the silicon oxide 350a and may have a first thickness in the first region and a second thickness smaller than the first thickness in the second region. That is, the first semiconductor layers 352a and 352b may be formed on the silicon oxide 350a and may have a thirst thickness in the first region and a second thickness smaller than the first thickness in the second region. In example embodiments, the first semiconductor layers 352a and 352b may be provided as first and second nanowire patterns through subsequent processes.

Referring to FIG. 18B, the first semiconductor layers 352a and 352b, and the silicon oxide 350a may be patterned to form first and second preliminary channel structures 380 and 382 in the first and second regions, respectively. The first and second preliminary channel structures 380 and 382 may have a stacked structure of the oxide layer and the semiconductor layer.

In example embodiments, the silicon oxide 350a formed on the SOI substrate may be provided as a sacrificial layer to be removed in a subsequent process. The silicon oxide 350a in example embodiments may have the same function as the first semiconductor layer explained in FIG. 1, and the first semiconductor layer may have the same function as the second semiconductor layer explained in FIG. 1.

The processes explained referring to FIGS. 4D to 4I may be performed to form the structure illustrated in FIG. 16. The selectively removed portion in FIG. 4G may be the oxide 350a.

According to the above-described processes, the on current properties of MOS transistors formed in each region may be controlled by controlling the vertical length of the first and second nanowire patterns. Particularly, MOS transistors having target on currents may be provided without enlarging the horizontal region occupied by a semiconductor device.

Seventh Embodiment

Figure 19:
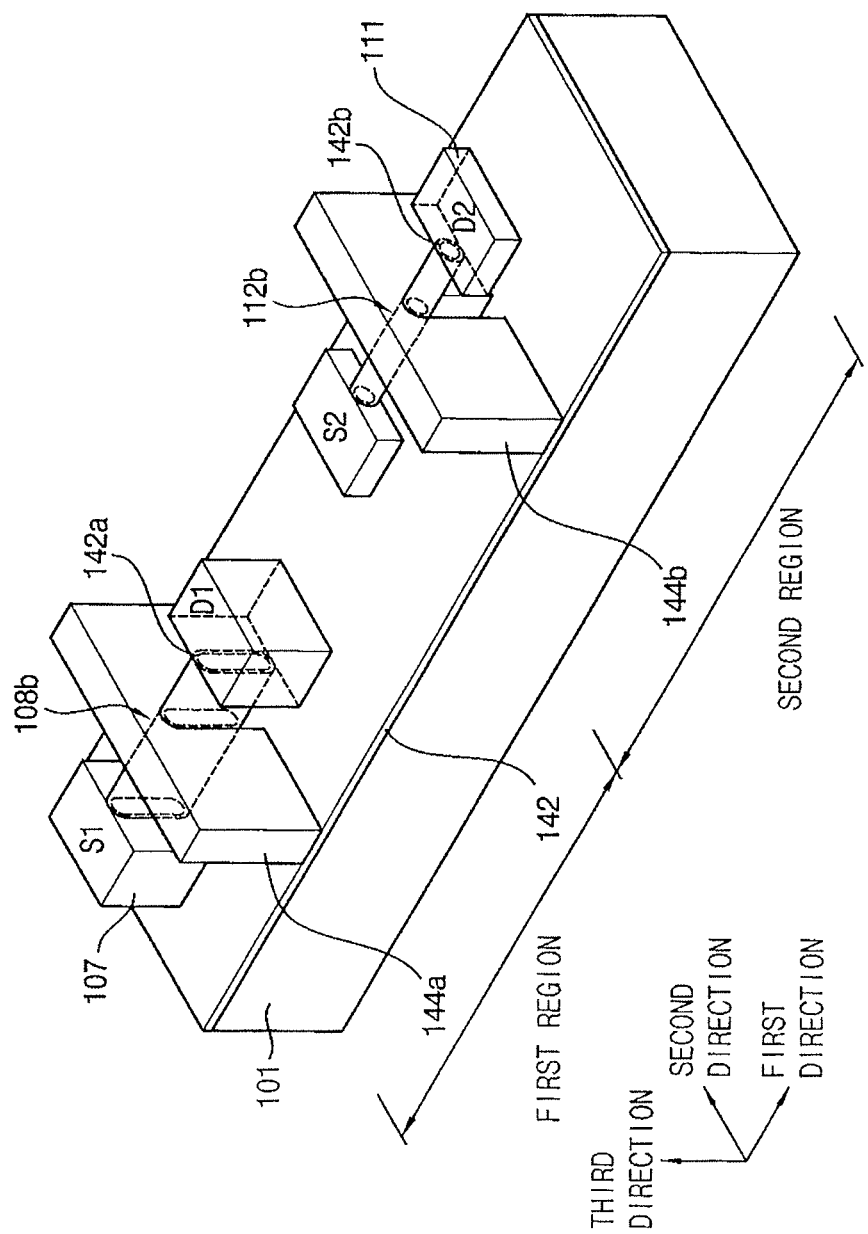
FIG. 19 illustrates a seventh embodiment of a semiconductor device.

FIG. 19 illustrates a seventh embodiment of a semiconductor device, which may be the same as the first embodiment except for the first and second semiconductor structures and the shape of the first and second gate structures.

Referring to FIG. 19, a first nanowire pattern 108b may be provided in the first region of a substrate, and a first MOS transistor may be provided at the first nanowire pattern 108a. A second nanowire pattern 112b may be provided in the second region of the substrate, and a second MOS transistor may be provided at the second nanowire pattern 112b. The first and second nanowire patterns 108b and 112b may have the same structure as the first and second nanowire patterns explained referring to FIG. 1.

The first semiconductor structure 107 may be connected with respective end portions of the first nanowire pattern 108b. The first semiconductor structure 107 may not contact the substrate 100 and may have a separated shape from the substrate 100. The first semiconductor structure 107 may be formed by using the same material as the first nanowire pattern 108b. The first source/drain regions S1 and D1 of the first MOS transistor may be provided in the first semiconductor structure 107.

The second semiconductor structure 111 may be connected to respective end portions of the second nanowire pattern 112b. The second semiconductor structure 111 may not contact the substrate 100, but may be separated from the substrate 100. The second semiconductor structure 111 may be formed by using the same material as the second nanowire pattern 112b. The second source/drain regions S2 and D2 of the second MOS transistor may be provided in the second semiconductor structure 111.

A first gate insulating layer 142a may be provided on the surface of the first nanowire pattern 108b. A first gate electrode 144a may be provided on the first gate insulating layer 142a. The first gate electrode 144a may have a shape surrounding the surface of the first nanowire pattern 108b. The first gate electrode 144a may not contact the bottom surface of the first nanowire pattern 108b. The first gate electrode 144a may have a shape surrounding at least the side wall and the upper surface of the first nanowire pattern 108b and may support the first nanowire pattern 108b.

A second gate insulating layer 142b may be provided on the surface of the second nanowire pattern 112b. A second gate electrode 144b may be provided on the second gate insulating layer 142b. The second gate electrode 144b may have a shape surrounding the surface of the second nanowire pattern 112b. The second gate electrode 144b may not contact the bottom surface of the first nanowire pattern 108b. The second gate electrode 144b may have a shape surrounding at least the side wall and the upper surface of the second nanowire pattern 112b and may support the second nanowire pattern 112b.

Additionally, an insulating interlayer may be provided to cover the first and second nanowire patterns, first and second gate electrodes, and first and second semiconductor structures. Thus, the first and second nanowire patterns and the first and second semiconductor structures may be supported by the insulating interlayer.

Figure 20:
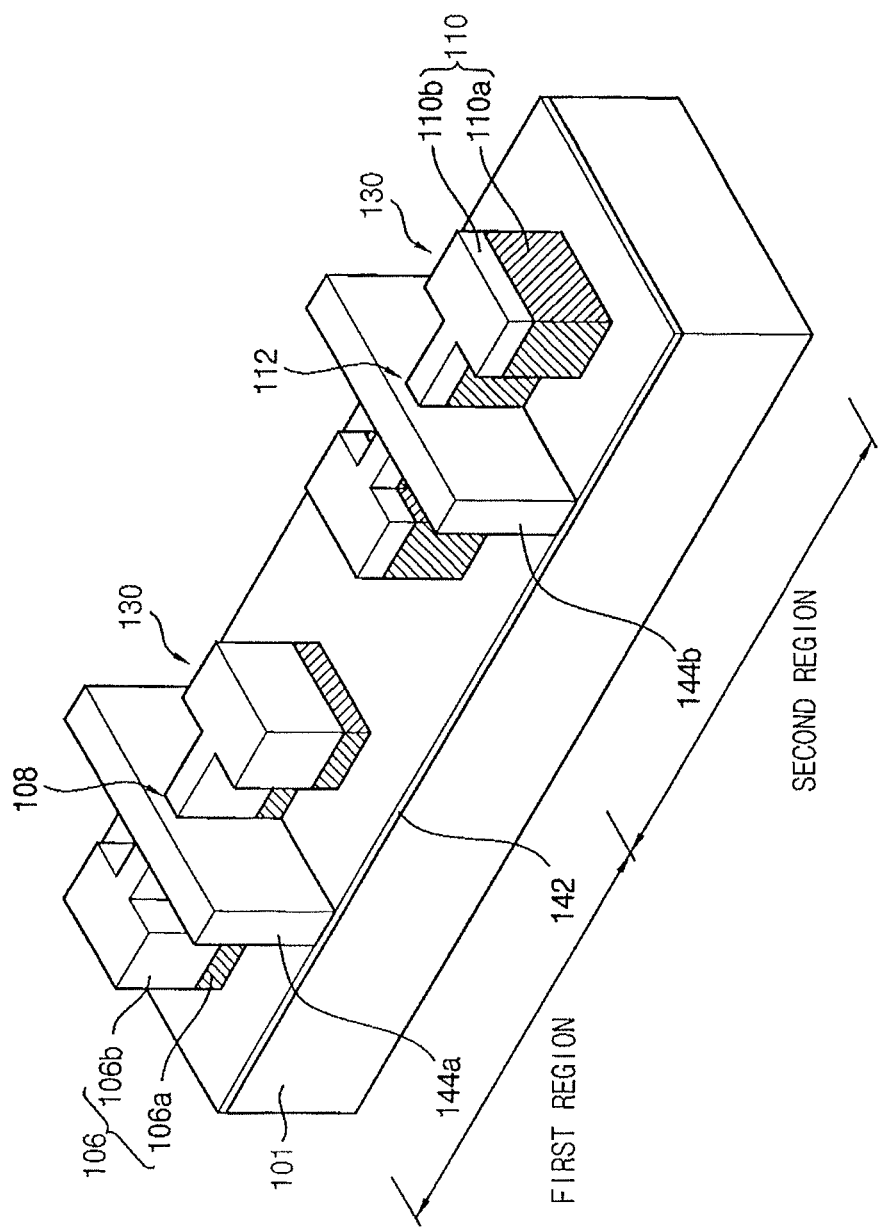
FIG. 20 illustrates a perspective view provided to explain a method of manufacturing the semiconductor device in FIG. 19.

FIG. 20 illustrates an embodiment of a method of manufacturing the semiconductor device in FIG. 19. First, the same processes explained referring to FIGS. 4A to 4D may be performed to form the structure illustrated in FIG. 4D.

Referring to FIG. 20, on the surface of the first and second nanowire structures 108 and 112, first and second gate insulating layers may be formed. The first and second gate insulating layers may be also formed on the surface of the substrate 100 and the first and second semiconductor structures 106 and 110.

A gate electrode layer may cover the substrate 100. First and second preliminary active structures 130 and 132 may be formed on the first and second gate insulating layers 142a and 142b. The gate electrode layer may be patterned to form first and second gate electrodes 144a and 144b. The first gate electrode 144a may have a shape traversing the first nanowire structure 108. The second gate electrode 144b may have a shape traversing the second nanowire structure 112.

Then, the first semiconductor layer included in the first and second preliminary active structures 130 and 132 may be selectively removed. By performing the removing process, the first and second nanowire patterns 108b and 112b separated from the substrate and the first and second semiconductor structures 107 and 111 may be formed. The first and second nanowire patterns 108b and 112b and the first and second semiconductor structures 107 and 111 may be supported by the first and second gate electrodes 144a and 144b. Then, the structure illustrated in FIG. 19 may be formed.

Additionally, an insulating interlayer covering the first and second nanowire patterns 108b and 112b, the first and second gate electrodes 144a and 144b, and the first and second semiconductor structures 106 and 110 may be formed.

In the above-described processes, the on current properties of a MOS transistor formed in each region may be controlled by controlling the vertical length of the first and second nanowire patterns. Particularly, MOS transistors having target on currents may be provided without enlarging the horizontal region occupied by a semiconductor device.

According to the example embodiments, contact plugs having various heights may be easily formed. Thus, the method in accordance with example embodiments may be applied in a semiconductor device including contact plugs. Particularly, the method in accordance with example embodiments may be applied in a semiconductor memory device in which cells may be stacked in the vertical direction.

According to example embodiments, a first transistor and a second transistor having target on current properties may be formed at a first nanowire pattern and a second nanowire pattern having different capacities. The first and second nanowire patterns may have different lengths in a vertical direction on a cross-section. Thus, the on current properties of each transistor included in the semiconductor device may be easily controlled without enlarging the horizontal area of the semiconductor device.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of manufacturing a semiconductor device, the method comprising:
    forming a first semiconductor material layer in a first region and a second region of a substrate;
    forming a second semiconductor material layer on the first semiconductor material layer, the second semiconductor material layer including a material different from the first semiconductor material and having a thickness in the second region greater than a thickness in the first region;
    patterning the first and second semiconductor material layers to form first and second nanowire structures having a first width in a horizontal region respectively in the first region and the second region;
    selectively removing the first semiconductor material layer in the first and second nanowire structures to respectively form a first nanowire pattern in the first region of the substrate and to form a second nanowire pattern in the second region of the substrate, the first nanowire pattern having a first width in a horizontal direction of a cross-section of the first nanowire pattern and a first vertical length in a vertical direction of the cross-section of the first nanowire pattern, the second nanowire pattern having a first width in the horizontal direction of a cross-section of the second nanowire pattern and a second vertical length greater than the first vertical length in the vertical direction of the cross-section of the second nanowire pattern;
    forming a first MOS transistor including a first gate structure and first source/drain regions in the first nanowire pattern; and
    forming a second MOS transistor including a second gate structure and second source/drain regions in the second nanowire pattern.

2. The method as claimed in claim 1, wherein the first semiconductor material layer includes a semiconductor material having a predetermined etching selectivity with respect to the second semiconductor material layer.

3. The method as claimed in claim 1, wherein the thickness of the first semiconductor material layer on the substrate in the first region is less than the thickness of the first semiconductor material layer on the substrate in the second region.

4. The method as claimed in claim 1, further comprising:
    performing an annealing process or an oxidation process for rounding edge portions of the first and second nanowire patterns, wherein the annealing or oxidation processor is performed after forming the first and second nanowire patterns.

5. The method as claimed in claim 1, further comprising:
    forming a third nanowire pattern and a fourth nanowire pattern including a third semiconductor material different from the second semiconductor material layer,
    wherein forming the third nanowire pattern and the fourth nanowire pattern includes performing a thermal oxidation process at each of a plurality of surface portions of the first and second nanowire patterns, to diffuse at least a portion of materials forming the first and second nanowire patterns, after forming the first and second nanowire patterns.

6. The method as claimed in claim 1, further comprising:
    (a) forming extended dummy gate patterns surrounding the first and second nanowire structures;
    (b) forming an insulating interlayer pattern to fill a gap between the dummy gate patterns; and
    (c) removing the dummy gate patterns between the insulating interlayer patterns to form an opening portion exposing a gate electrode forming portion, wherein (a), (b), and (c) are performed after forming the first and second nanowire structures.

7. The method as claimed in claim 2, wherein:
    the first semiconductor material layer includes silicon germanium, and
    the second semiconductor material layer includes single crystalline silicon.

8. A semiconductor device, comprising:
    a first transistor including a first nanowire extending through a first gate electrode and between first source and drain regions; and
    a second transistor including a second nanowire extending through a second gate electrode and between a second source and drain regions, wherein the first nanowire has a first size in a first direction and a second size in a second direction, and the second nanowire has a third size in the first direction and substantially the second size in the second direction, wherein the second size in the second direction is one of a cross-sectional width or height of the first and second nanowires, and wherein:
    the first transistor has a first conductivity type,
    the second transistor has a second conductivity type, and
    the first and second transistors correspond to a CMOS device.

9. The semiconductor device as claimed in claim 8, wherein:
    the first transistor has a first on current,
    the second transistor has a second on current, and
    the on current of the first transistor is substantially equal to the on current of the second transistor based on a difference between the first size of the first nanowire in the first direction and the third size of the second nanowire in the first direction.

10. The semiconductor device as claimed in claim 8, wherein:
    the first transistor has a first on current,
    the second transistor has a second on current different from the first on current.

11. The semiconductor device as claimed in claim 8, wherein:
a length of the first nanowire in a third direction is substantially equal to a width of the first gate electrode, or
a length of the second nanowire in the third direction is substantially equal to a width of the second gate electrode.

12. The semiconductor device as claimed in claim 8, wherein:
a length of the first nanowire in a third direction is substantially equal to a width of the first gate electrode, and
a length of the second nanowire in the third direction is substantially equal to a width of the second gate electrode.

13. The semiconductor device as claimed in claim 8, wherein:
the first nanowire has a first capacity of charge carrier mobility, and
the second nanowire has a second capacity of charge carrier mobility different from the first capacity of charge carrier mobility.

14. The semiconductor device as claimed in claim 8, wherein the first size in the first direction is greater than the third size in the first direction.

15. The semiconductor device as claimed in claim 8, wherein:
the first and second transistors are formed on a substrate,
the first nanowire is spaced from the substrate by a first distance, and
the second nanowire is spaced from the substrate by a second distance different from the first distance.

16. The semiconductor device as claimed in claim 8, wherein the first source and drain regions are provided at a first semiconductor structure including a first semiconductor material and a second semiconductor material, and wherein the second source and drain regions are provided at a second semiconductor structure including the first semiconductor material and the second semiconductor material.

17. The semiconductor device as claimed in claim 8, wherein the first and second transistors have substantially equal on currents.

18. The semiconductor device as claimed in claim 14, wherein an upper surface of the first nanowire is substantially coplanar with an upper surface of the second nanowire.

19. A semiconductor device, comprising:
a first transistor including a first nanowire extending through a first gate electrode and between first source and drain regions; and
a second transistor including a second nanowire extending through a second gate electrode and between a second source and drain regions, wherein the first nanowire has a first cross-sectional size different from a first cross-sectional size of the second nanowire and a second cross-sectional size substantially equal to a second cross-sectional size of the second nanowire, and wherein:
the first transistor has a first conductivity type,
the second transistor has a second conductivity type, and
the first and second transistors correspond to a CMOS device.

* * * * *